United States Patent
Yamaguchi

(10) Patent No.: US 9,842,871 B2
(45) Date of Patent: Dec. 12, 2017

(54) METHOD OF MANUFACTURING SEMICONDUCTOR DEVICE

(71) Applicant: RENESAS ELECTRONICS CORPORATION, Tokyo (JP)

(72) Inventor: Tadashi Yamaguchi, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 14/992,103

(22) Filed: Jan. 11, 2016

(65) Prior Publication Data

US 2016/0218125 A1 Jul. 28, 2016

(30) Foreign Application Priority Data

Jan. 22, 2015 (JP) ................. 2015-010744

(51) Int. Cl.
H01L 27/146 (2006.01)

(52) U.S. Cl.
CPC ...... *H01L 27/1461* (2013.01); *H01L 27/1463* (2013.01); *H01L 27/14612* (2013.01); *H01L 27/14627* (2013.01); *H01L 27/14689* (2013.01); *H01L 27/14698* (2013.01)

(58) Field of Classification Search
CPC .......... H01L 27/14612; H01L 29/7869; H01L 27/14689; H01L 27/14643; H01L 2924/00
See application file for complete search history.

(56) References Cited

U.S. PATENT DOCUMENTS

| | | | |
|---|---|---|---|
| 7,719,040 B2 | 5/2010 | Nagasaki et al. | |
| 7,936,036 B2 | 5/2011 | Tanaka et al. | |
| 2004/0121619 A1* | 6/2004 | Yokoi | A61B 5/04001 438/784 |
| 2005/0101070 A1 | 5/2005 | Tsujiuchi et al. | |
| 2007/0221973 A1 | 9/2007 | Nagasaki et al. | |
| 2014/0353665 A1* | 12/2014 | Fujii | H01L 21/18 257/48 |
| 2016/0043130 A1* | 2/2016 | Ohguro | H01L 27/1463 257/225 |

FOREIGN PATENT DOCUMENTS

| | | |
|---|---|---|
| JP | 2005-142319 A | 6/2005 |
| JP | 2006-59842 A | 3/2006 |
| JP | 2007-67379 A | 3/2007 |
| JP | 2007-288136 A | 11/2007 |
| JP | 2008-60383 A | 3/2008 |
| JP | 2009-277722 A | 11/2009 |

* cited by examiner

*Primary Examiner* — Tony Tran
(74) *Attorney, Agent, or Firm* — Sughrue Mion, PLLC

(57) ABSTRACT

Object is to prevent deterioration in pixel characteristics due to dark-time white spot defects in a pixel. Generation of these dark-time white spot defects is attributable to diffusion of electrons and Fe (iron) from the vicinity of an interface between a semiconductor substrate and an element isolation region obtained by filling a trench formed in the upper surface of the semiconductor substrate with an insulating film. A semiconductor layer is formed by forming, in the upper surface of a semiconductor substrate, a trench for filling it with an element isolation region surrounding a photodiode formation region; and carrying out plasma doping to introduce B (boron) into the side wall and bottom surface of the trench.

17 Claims, 18 Drawing Sheets

METHOD OF MANUFACTURING SEMICONDUCTOR DEVICE

CROSS-REFERENCE TO RELATED APPLICATIONS

The disclosure of Japanese Patent Application No. 2015-010744 filed on Jan. 22, 2015 including the specification, drawings, and abstract is incorporated herein by reference in its entirety.

BACKGROUND

The present invention relates to a method of manufacturing a semiconductor device, particularly, a technology effective when applied to the manufacture of a semiconductor device including an image pickup element.

Image pickup elements (imaging devices) to be used for digital cameras and the like are each comprised of, for example, a plurality of pixels arranged in matrix form and including a photodiode that detects light and generates charges. As the configuration of a pixel, known is that having the photodiode, a transfer transistor for outputting the charges to peripheral elements, and the peripheral elements, for example, for amplifying signals. The layout of the photodiode formed on the main surface of a semiconductor substrate is defined by an element isolation region surrounding the periphery of the photodiode. As a method of forming the element isolation region, known is a method of forming a trench in the main surface of the semiconductor substrate, filling the trench with an insulating film, and thereby forming the element isolation region made of the insulating film.

Patent Document 1 (Japanese Unexamined Patent Application Publication No. 2005-142319), Patent Document 2 (Japanese Unexamined Patent Application Publication No. 2008-60383), and Patent Document 3 (Japanese Unexamined Patent Application Publication No. 2006-59842) describe removal of damage and metal contamination generated in an element isolation trench. Patent Document 4 (Japanese Unexamined Patent Application Publication No. 2007-67379), Patent Document 5 (Japanese Unexamined Patent Application Publication No. 2007-288136), and Patent Document 6 (Japanese Unexamined Patent Application Publication No. 2009-277722) describe implantation of boron into side walls of the trench.

Patent Documents

[Patent Document 1] Japanese Unexamined Patent Application Publication No. 2005-142319
[Patent Document 2] Japanese Unexamined Patent Application Publication No. 2008-60383
[Patent Document 3] Japanese Unexamined Patent Application Publication No. 2006-59842
[Patent Document 4] Japanese Unexamined Patent Application Publication No. 2007-67379
[Patent Document 5] Japanese Unexamined Patent Application Publication No. 2007-288136
[Patent Document 6] Japanese Unexamined Patent Application Publication No. 2009-277722

SUMMARY

When an element isolation region is formed by filling a trench in the upper surface of a semiconductor substrate with an insulating film, electrons are likely to occur at the boundary between the element isolation region and the semiconductor substrate. Diffusion of the electrons in a photodiode may lead to a problem of deterioration in pixel characteristics. In addition, iron (Fe) is mixed in the side wall and bottom surface of the trench during forming the trench and the iron diffused if any in the photodiode may also lead to a problem of deterioration in pixel characteristics.

As a method of overcoming the above-described problems, implantation of boron (B) into the side wall and bottom surface of the trench by ion implantation can be given, but this damages the side wall and bottom surface of the trench and in addition, reduces a light receiving area of a photodiode surrounded by the element isolation region, leading to a problem of deterioration in pixel characteristics.

Another object and novel features will be apparent from the description herein and accompanying drawings.

Outline of typical embodiments, among embodiments disclosed herein, will next be described briefly.

A method of manufacturing a semiconductor device according to one embodiment includes forming, in the upper surface of a semiconductor substrate, a trench for filling it with an element isolation region that surrounds a photodiode formation region and performing plasma doping to introduce B (boron) into the side wall and bottom surface of the trench.

The one embodiment disclosed herein can provide a semiconductor device having improved reliability. In particular, it can prevent deterioration in pixel characteristics.

DETAILED DESCRIPTION

Figure 1:
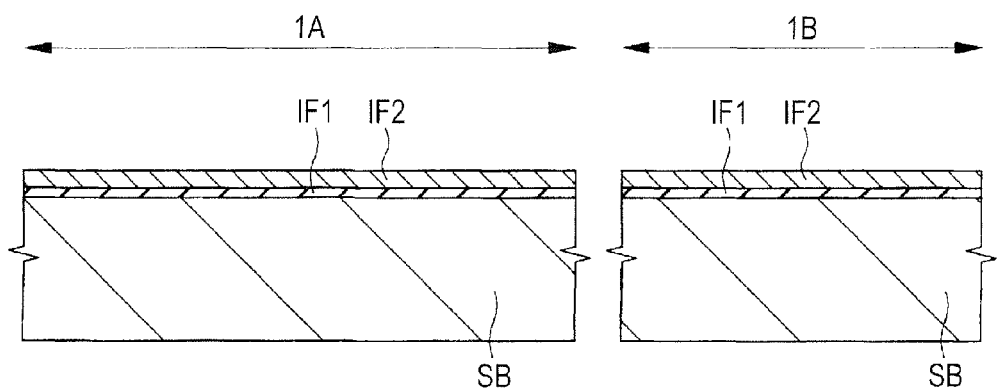
FIG. 1 is a cross-sectional view for describing a manufacturing step of a semiconductor device of First Embodiment of the present invention.

The embodiments of the invention will hereinafter be described specifically based on drawings. In all the drawings for describing the embodiment, members having the same function will be identified by the same reference numerals and overlapping descriptions will be omitted. In the following embodiments, a description on the same or similar portions will not be repeated in principle unless particularly necessary.

The symbol "−" and "+" means a relative concentration of an impurity having an N or P conductivity type. For example, an impurity concentration of an N type impurity is higher in the following order: "N$^-$", "N", and "N$^+$". These conductivity types "N$^-$", "N", and "N$^+$" may be called "N" collectively irrespective of a difference in concentration. This may also apply to a P type semiconductor.

First Embodiment

The semiconductor device of the present embodiment relates to an image pickup element (solid-state image pickup element), in particular, to an image pickup device in which a photodiode forming a pixel is surrounded by an element isolation region having an STI (shallow trench isolation) structure. The image pickup element is a CMOS (complementary metal oxide semiconductor) image sensor.

In the present embodiment, deterioration in pixel characteristics due to diffusion of electrons and iron (Fe) into a photodiode is prevented by uniformly introducing boron (B), by using a plasma doping apparatus, into a side wall and bottom surface of a trench to be filled with an element isolation region. Here, as one example of a pixel, a 4-transistor type pixel to be used as a pixel realizing circuit in a CMOS image sensor will be described, but the pixel is not limited thereto.

<Method of Manufacturing a Semiconductor Device>

The method of manufacturing a semiconductor device of the present embodiment will be described referring to FIGS. 1 to 21. FIG. 1, FIG. 2, and FIGS. 4 to 21 are cross-sectional views for describing manufacturing steps of the semiconductor device of the present embodiment. FIG. 3 is a cross-sectional view of a plasma doping apparatus to be used in the manufacturing step of the semiconductor device of the present embodiment.

In FIGS. 1 to 21, a cross-section in a pixel region 1A is shown on the left side and a cross-section in a logic circuit region 1B is shown on the right side. The pixel region 1A and the logic circuit region 1B are, on the same semiconductor substrate, regions adjacent to each other in a direction along the main surface of the semiconductor substrate. The pixel region 1A is a region in which a photodiode and peripheral elements thereof are to be formed, while the logic circuit region 1B is a region in which a MOSFET (metal oxide semiconductor field effect transistor, MOS type field effect transistor) configuring an analog digital conversion circuit and the like are to be formed. Here, a step of forming an N type MOSFET in the logic circuit region 1B will be described, but a P type MOSFET is also formed in a portion of the logic circuit region 1B not shown in the drawing. This means that CMOS is formed in the logic circuit region 1B.

First, as shown in FIG. 1, a semiconductor substrate SB is provided. The semiconductor substrate SB is made of, for example, single crystal silicon (Si). An insulating film IF1 made of a silicon oxide film is then formed on the semiconductor substrate SB using, for example, thermal oxidation. An insulating film IF2 made of, for example, a silicon nitride film is then formed on the insulating film IF1 using, for example, CVD (chemical vapor deposition). The main surface of the semiconductor substrate SB is therefore covered by a stacked film of the insulating films IF1 and IF2.

Figure 2:
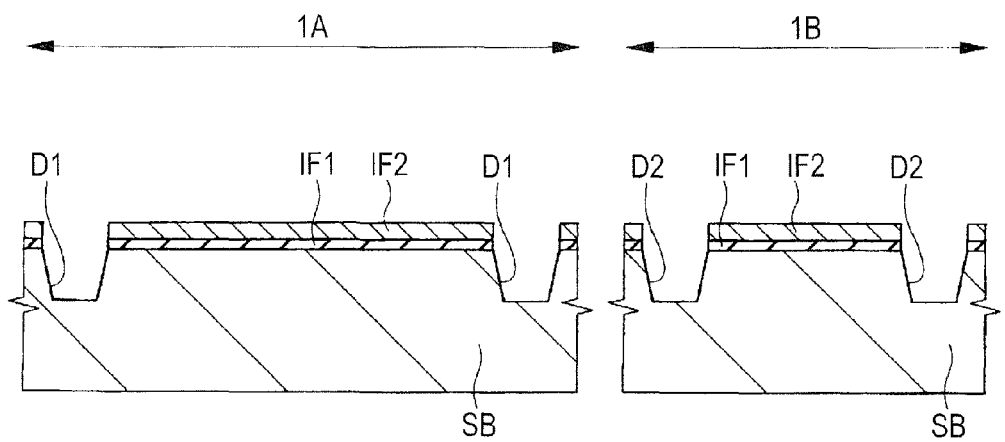
FIG. 2 is a cross-sectional view of the semiconductor device during a manufacturing step following that of FIG. 1.
Figure 3:
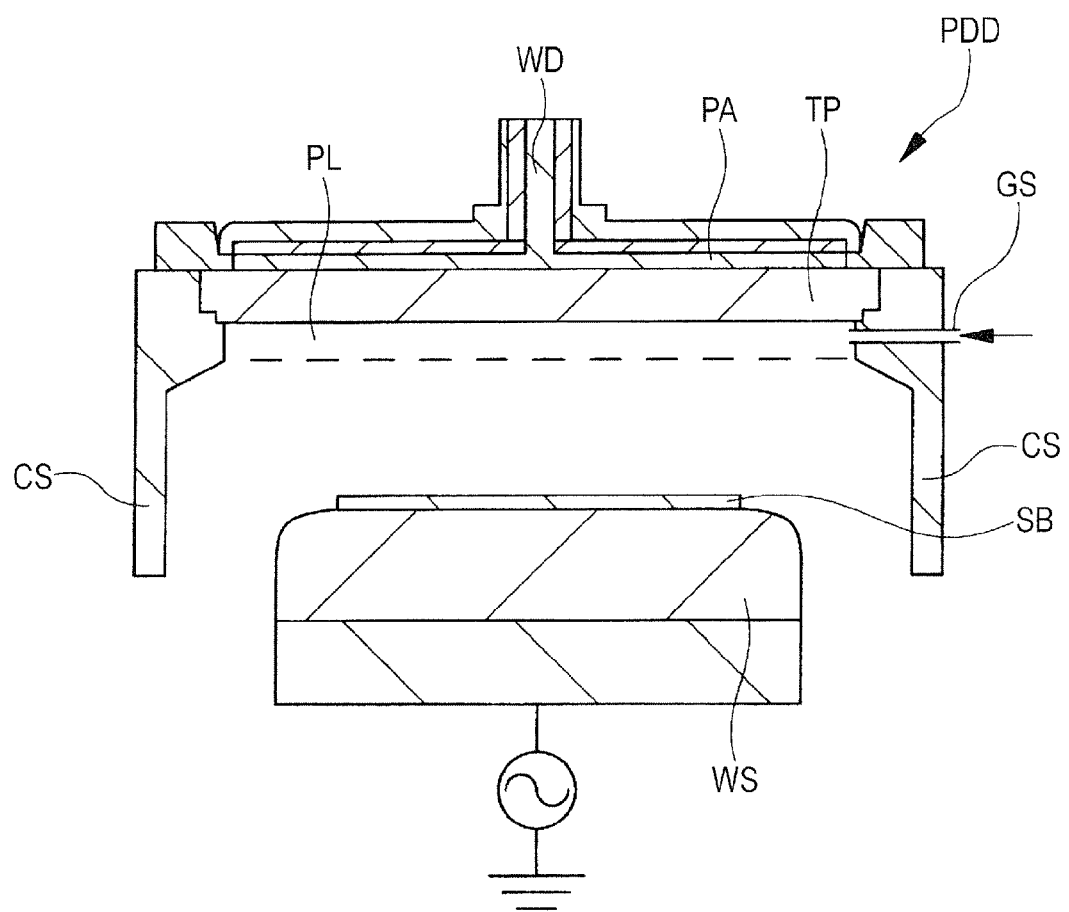
FIG. 3 is a cross-sectional view of a plasma doping apparatus to be used in the manufacturing step of the semiconductor device of First Embodiment of the present invention.

Next, as shown in FIG. 2, a portion of the stacked film is removed from each of the pixel region 1A and the logic circuit region 1B by photolithography and etching. By this removal, a portion of the main surface of the semiconductor substrate SB is exposed from the insulating films IF1 and IF2. In this step, the insulating films IF1 and IF2 on the semiconductor substrate SB in active regions such as a region in which a photodiode will be formed in a later step and a region in which a MOSFET will be formed in a later step are left and the insulating films IF1 and IF2 in the other region (field region) is removed.

With the insulating films IF1 and IF2 as a mask, dry etching is then carried out to form trenches D1 and D2 in the upper surface of the semiconductor substrate SB. In other words, trenches D1 and D2 are formed using anisotropic etching, with the insulating films IF1 and IF2 as a mask pattern. The trench D1 is formed in the pixel region 1A and the trench D2 is formed in the logic circuit region 1B. The trench D1 has a cyclic form so as to surround, in plan view, the region in which a photodiode will be formed in a later step. The trenches D1 and D2 each have a similar depth and the bottom surface of each of the trenches D1 and D2 reaches the middle of the depth of the semiconductor substrate SB. Deposits such as etching residues are then removed by washing with hydrofluoric (HF) acid.

The above-described dry etching for forming the trenches D1 and D2 is anisotropic etching and it damages the surface of the semiconductor substrate SB exposed inside each of the trenches D1 and D2. It also allows introduction of iron (Fe) into the surface of the semiconductor substrate SB exposed inside each of the trenches D1 and D2. The iron is not intentionally introduced into the side wall and bottom surface of each of the trenches D1 and D2 but it is, together with nickel (Ni) and chromium (Cr), introduced into the exposed surface of the semiconductor substrate SB during dry etching for forming the trenches D1 and D2. This means that Fe contamination occurs on the side wall and bottom surface of each of the trenches D1 and D2.

Figure 4:
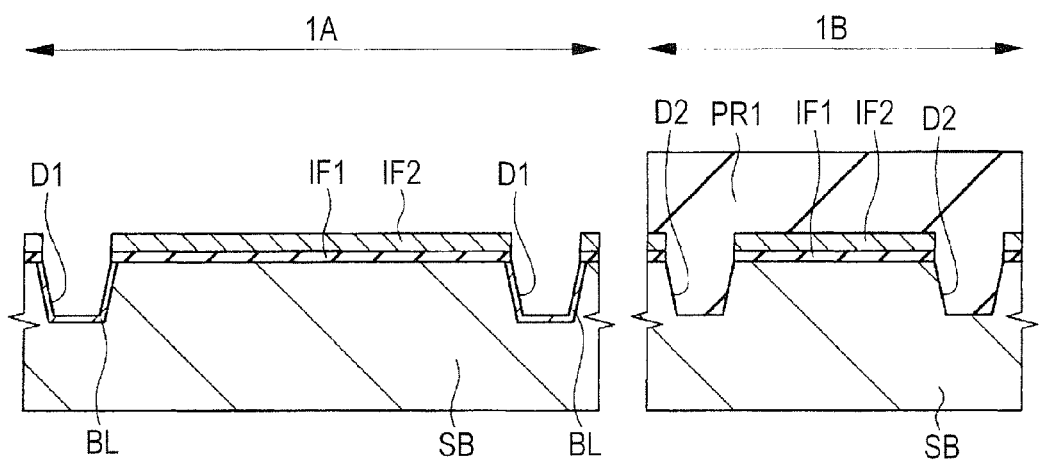
FIG. 4 is a cross-sectional view of the semiconductor device during a manufacturing step following that of FIG. 2.

Next, after the logic circuit region 1B is covered with a photoresist film PR1, boron (B) is introduced into the surface of the semiconductor substrate SB exposed from the insulating films IF1 and IF2, that is, into the side wall and bottom surface of the trench D1 as shown in FIG. 4 by plasma doping with a plasma doping apparatus shown in FIG. 3. This means that plasma doping is performed while covering the logic circuit region 1B with a photoresist film PR1 and exposing the pixel region 1A from the photoresist film PR1. The semiconductor substrate SB in the logic circuit region 1B is covered with the photoresist film PR1 so that boron is not introduced into the side wall and bottom surface of the trench D2.

Here, the reason why plasma doping is performed while covering the semiconductor substrate SB in the logic circuit region 1B with the photoresist film PR1 and boron is not introduced into the side wall and bottom surface of the trench D2 is to prevent a transistor, which will be formed later in the logic circuit region 1B, from having unstable characteristics. In other words, boron introduced into an end portion of the active region of a transistor to be formed later in the logic circuit region 1B, that is, for example, an end portion of a source/drain region or an end portion of a channel region may cause variations in threshold voltage of the transistor, resulting in failure in normal operation of circuits including the transistor. Boron is therefore not introduced into the side wall and bottom surface of the trench D2 in the logic circuit region 1B.

As shown in FIG. 3, a plasma doping apparatus PDD is comprised of a container CS configuring a chamber, a wafer stage (placing table) WS placed in the container CS, a top plate (TP) placed above the wafer stage WS in the container CS, a planar antenna PA placed on the top plate TP, and a waveguide WD placed on the planar antenna PA. The waveguide WD is coupled to a microwave generator (not shown). The container CS has, in the side wall thereof at a height between the wafer stage WS and the top plate TP, a gas supply unit GS for introducing a plasma stabilizing gas and a doping gas into the container CS. The gas in the container CS can be discharged using a pump (not shown) and the container CS can be evacuated.

Here, a plasma doping method is used and the surface of the semiconductor substrate (semiconductor wafer) SB to be treated is doped, using plasma, with an impurity element (boron) contained in a doping gas. More specifically, first, the semiconductor substrate SB is placed on the wafer stage WS so as to be brought into contact with the upper surface thereof. The pressure in the container CS is from 50 to 150 mTorr, preferably 50 mTorr. Radio frequency power (RF: radiofrequency) for bias can be applied to the wafer stage WS but in the present embodiment, RF bias is not applied. This means that RF bias applied to the wafer stage WS is 0 W.

Then, a mixed gas of $B_2H_6$ (diborane) and He (helium) is supplied as a doping gas from the gas supply unit GS into the container CS and a microwave of 3 kW output is supplied from the microwave generator to the planar antenna PA via the waveguide WD. Plasma PL is generated in a region in the upper part of the container CS and below the top plate TP and doping is performed using plasma. An impurity element (boron) in the doping gas is thereby introduced into the surface of the semiconductor substrate SB.

By the above plasma doping, boron (B) is introduced into the surface of the semiconductor substrate SB exposed from the insulating films IF1 and IF2, that is, into the side wall and bottom surface of the trench D1 as shown in FIG. 4 and a semiconductor layer BL containing boron is formed. The B (boron) contained in the doping gas and the semiconductor layer BL contains boron isotopes $^{10}B$ and $^{11}B$. A boron doping amount in the semiconductor layer BL is from $5\times10^{13}$ to $2\times10^{14}$ $cm^{-2}$ and the thickness of the semiconductor layer BL is, for example, from 1 to 2 nm. The semiconductor layer BL is formed neither in the logic circuit region 1B covered with the photoresist film PR1 nor on the surface of the semiconductor substrate SB covered with the insulating films IF1 and IF2.

The reason why the RF bias applied to the wafer stage WS of the plasma doping apparatus PDD used for the above plasma doping is set at 0 W is to prevent positive incorporation of B (boron) ion (radical) in the plasma into the surface of the semiconductor substrate SB. This makes it possible to prevent the surface of the semiconductor substrate SB, that is, the side wall and bottom surface of the trench D1 from being damaged by plasma doping. In addition, since the RF bias is 0 W, the thickness of the semiconductor layer BL is relatively small. By suppressing the thickness of the semiconductor layer BL formed on the side wall of the trench D1 in such a manner, a light receiving area of the photodiode formed in a region surrounded by the trench D1 can be prevented from decreasing.

The pressure in the container CS is set at from 50 to 150 mTorr in the above plasma doping in order to prevent the surface of the semiconductor substrate SB, that is, the side wall and bottom surface of the trench D1 from being damaged by an excessively large pressure in the container CS. The pressure in the container CS is therefore preferably as low as about 50 mTorr.

As the doping gas to be used for the above plasma doping, a gas containing F (fluorine) is not used. Therefore, for example, a $BF_3$ gas is not used as the doping gas, because fluorine, as an impurity, has various bad influences on the semiconductor device. For example, when a fluorine gas is generated, it disturbs film formation to be performed after the plasma doping step and in addition, it becomes a cause of voids. When H (hydrogen) and the fluorine bind to each other to form HF (hydrogen fluoride, hydrofluoric acid), HF may melt a silicon oxide film or the like on the semiconductor substrate SB. Here, $B_2H_6$ (diborane), a fluorine-free gas, is used as the doping gas.

Next, although not illustrated here, the surface of the semiconductor substrate SB is washed with a chemical solution. Here, not hydrofluoric acid (HF) but APM (ammonia hydrogen peroxide mixture)/HPM (hydrochloric acid peroxide mixture) is used. Hydrofluoric acid is not used here because the thin semiconductor layer BL formed by the above plasma doping step is etched and removed by hydrofluoric acid. By this washing, the photoresist film PR1 covering the main surface of the semiconductor substrate SB in the logic circuit region 1B is removed.

Then, RTA (rapid thermal annealing) is performed for 30 seconds with heat of from 900 to 1100° C. This thermal treatment diffuses boron introduced into the semiconductor layer BL. Here, the thermal treatment is performed, for example, with heat of 900° C. The thermal treatment temperature is set at from 900 to 1100° C., because too low temperatures fail to sufficiently diffuse boron, while too high temperatures cause excessive diffusion, leading to a problem of reducing a light receiving area of a photodiode to be formed later.

By the plasma doping and the above thermal diffusion, the semiconductor layer BL having a predetermined depth from the surface of each of the side wall and bottom surface of the trench D1 is formed uniformly (conformally). More specifically, boron contained in the semiconductor layer BL is introduced into a depth within 20 nm from the surface of the semiconductor substrate SB at a concentration of $1 \times 10^{17}$ cm$^{-3}$ or more. This means that the semiconductor layer BL having boron diffused thereinto by the above thermal treatment has a thickness of 20 nm or more from the surface of the semiconductor substrate SB. The formation depth, from the surface of the semiconductor substrate SB, of the semiconductor layer BL having boron diffused thereinto by the above thermal treatment is deeper than the depth of the region of the side wall and bottom surface of the trench D1 into which iron has been introduced by the dry etching step described referring to FIG. 2. As will be described later, diffusion of iron into the active region in which a photodiode will be formed can be prevented with boron in the semiconductor layer BL.

The semiconductor layer BL having a boron concentration as described above is formed uniformly so as to surround, in plan view, a region (first region) in which a photodiode will be formed in a later step. A region surrounded by two trenches D1, which is shown in the drawing, includes not only the region in which a photodiode will be formed but also a region in which a transfer transistor to be described later will be formed.

Figure 5:
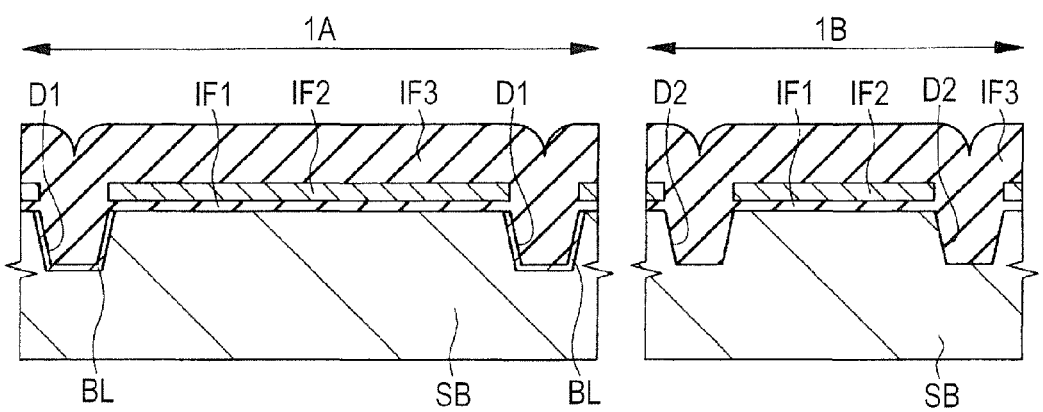
FIG. 5 is a cross-sectional view of the semiconductor device during a manufacturing step following that of FIG. 4.

Next, as shown in FIG. 5, an insulating film IF3 made of a silicon oxide film is formed on the entire main surface of the semiconductor substrate SB by using plasma CVD or low-pressure thermal CVD. The insulating film IF3 has a relatively large film thickness and it is formed so as to completely fill the trenches D1 and D2 therewith. Alternatively, before formation of the insulating film IF3, the side wall and bottom surface of each of the trenches D1 and D2 may be oxidized to form a thin oxide film.

Figure 6:
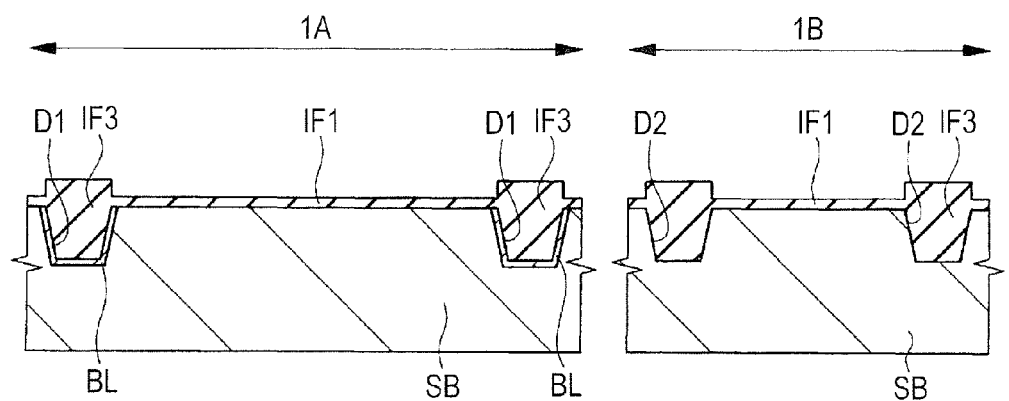
FIG. 6 is a cross-sectional view of the semiconductor device during a manufacturing step following that of FIG. 5.

Next, as shown in FIG. 6, the upper surface of the insulating film IF3 is polished using CMP (chemical mechanical polishing) to expose the insulating film IF2. The insulating film IF2 is then removed.

Figure 7:
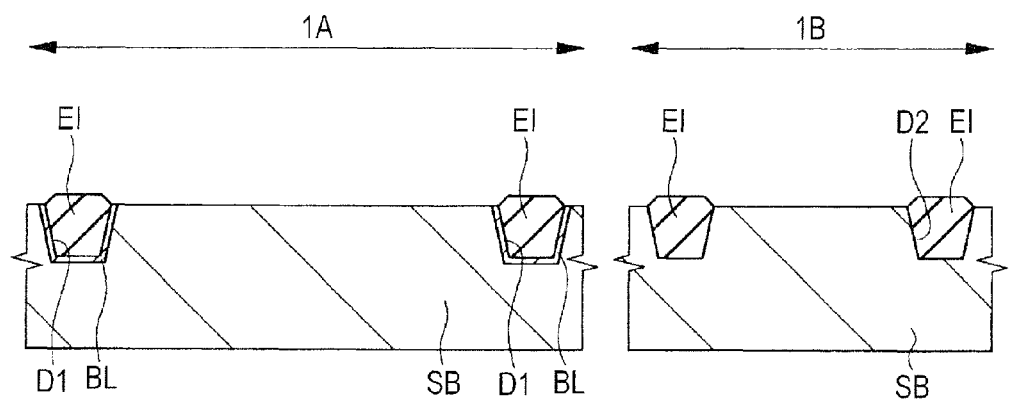
FIG. 7 is a cross-sectional view of the semiconductor device during a manufacturing step following that of FIG. 6.

Next, as shown in FIG. 7, wet etching is performed with hydrofluoric acid (HF) to remove the insulating film IF1 and a portion of the insulating film IF3. A portion of the main surface of the semiconductor substrate SB is thereby exposed. The trenches D1 and D2 have still the insulating film IF3 therein (refer to FIG. 6) and the side wall and bottom surface of each of the trenches D1 and D2 are not exposed. The insulating film IF3 which has remained inside each of the trenches D1 and D2 as a result of this etching configures an element isolation region EI. The element isolation region EI has an STI structure. In the present application, a region of the main surface of the semiconductor substrate SB exposed from the element isolation region EI is sometimes called "active region".

Figure 8:
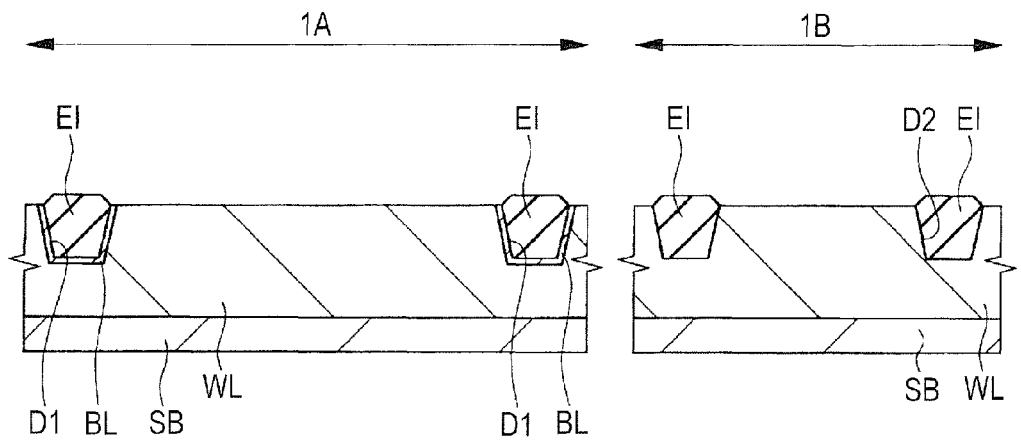
FIG. 8 is a cross-sectional view of the semiconductor device during a manufacturing step following that of FIG. 7.

Next, as shown in FIG. 8, a P type impurity (for example, B (boron)) is implanted into the main surface of the semiconductor substrate SB by using photolithography and ion implantation to form a P well WL. The P well is a P$^-$ type semiconductor region having a relatively low impurity concentration. Here, the well WL is formed in the main surface of the semiconductor substrate SB exposed in each of the pixel region 1A and the logic circuit region 1B. The formation depth of the well WL is deeper than the formation depth of the element isolation region EI.

In the present embodiment, formation of an N type MOSFET in the logic circuit region 1B will be described so that a P well WL is also formed in the logic circuit region 1B. Although not illustrated, in a region of the logic circuit region 1B where a P type MOSFET will be formed, on the other hand, an N well is formed by introducing an N type impurity (for example, P (phosphorus) or As (arsenic)) into the semiconductor substrate SB by an ion implantation step different from the above ion implantation step for forming the well WL.

Figure 9:
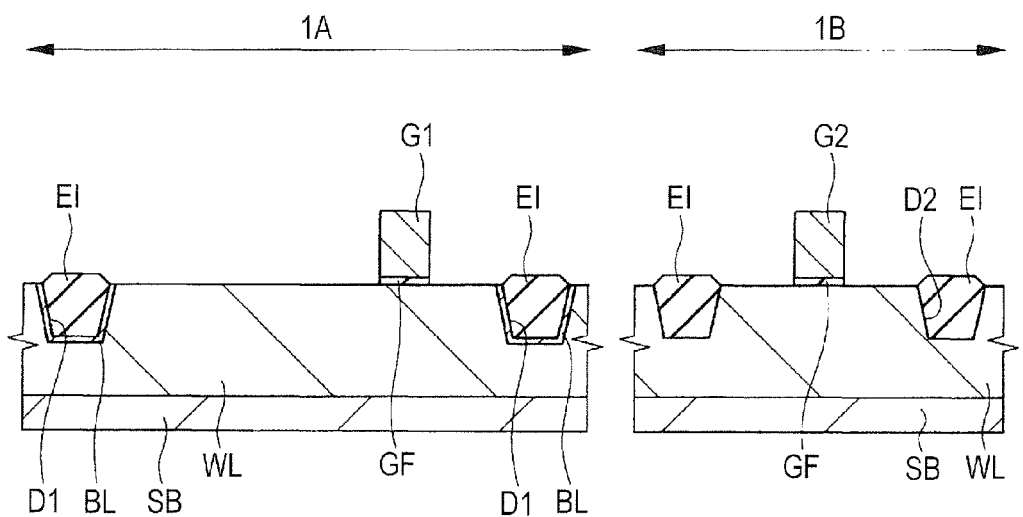
FIG. 9 is a cross-sectional view of the semiconductor device during a manufacturing step following that of FIG. 8.

Next, as shown in FIG. 9, a gate electrode G1 is formed on the semiconductor substrate SB in the pixel region 1A via a gate insulating film GF and a gate electrode G2 on the semiconductor substrate SB in the logic circuit region 1B via the gate insulating film GF. Described specifically, a silicon oxide film is formed on the semiconductor substrate SB, for example, by thermal oxidation. After formation of a conductor film made of, for example, polysilicon on the resulting silicon oxide film, the conductor film and the silicon oxide film are processed by photolithography and etching. As a result, the gate insulating film GF made of the silicon oxide film and the gate electrodes G1 and G2 each comprised of the conductor film are formed.

In the pixel region 1A, stacked films each comprised of the gate insulating film GF and the gate electrode G1 are, on the main surface of the semiconductor substrate SB exposed between the element isolation regions EI adjacent to each other, separated from the element isolation regions EI. Similarly, in the logic circuit region 1B, stacked films each comprised of the gate insulating film GF and the gate electrode G2 are, on the main surface of the semiconductor substrate SB exposed between the element isolation regions EI, separated from the element isolation regions EI. In a region not shown in the drawings, however, a portion of each of the gate electrodes G1 and G2 is formed right above the element isolation region EI.

Figure 10:
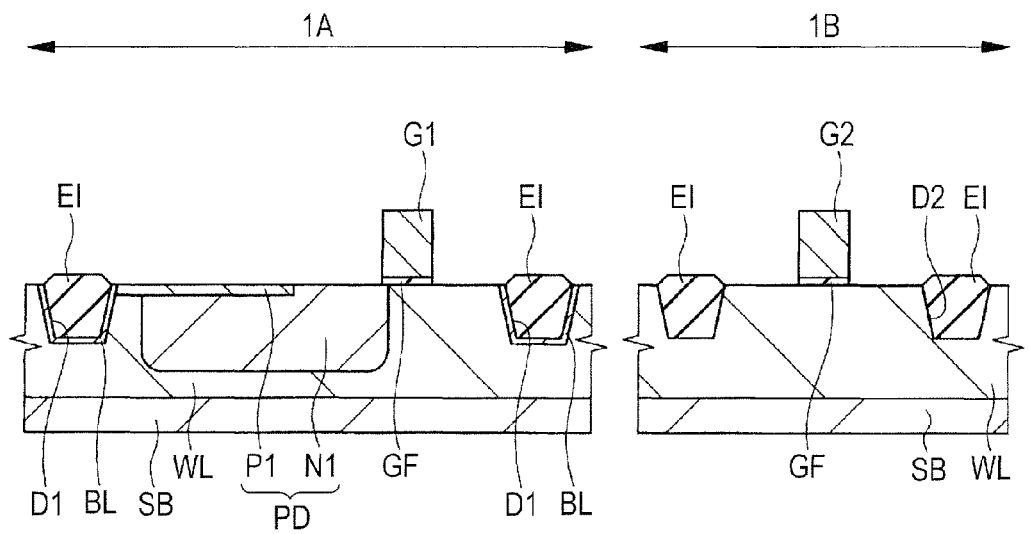
FIG. 10 is a cross-sectional view of the semiconductor device during a manufacturing step following that of FIG. 9.

Next, as shown in FIG. 10, a photodiode PD including an N$^-$ type semiconductor region N1 and a P$^+$ type semiconductor region P1 is formed in the upper surface of the semiconductor substrate B in the pixel region 1A by using photolithography and ion implantation. The N$^-$ type semiconductor region N1 has a formation depth greater than that of the P$^+$ type semiconductor region P1 and the element isolation region EI and smaller than that of the well WL. The P$^+$ type semiconductor region P1 has a formation depth smaller than that of the element isolation region EI. The photodiode PD is a photoelectric conversion element that generates signal charges in response to the amount of incident light.

Here, the N$^-$ type semiconductor region N1 is formed in a light-receiving-portion formation region by implanting an N type impurity (for example, P (phosphorus) or arsenic (As)) into the main surface of the semiconductor substrate SB in the pixel region 1A by ion implantation. Then, the P$^+$ type semiconductor region P1 is formed in the light-receiving-portion formation region by implanting a P type impurity (for example, B (boron)) into the main surface of the semiconductor substrate SB in the pixel region 1A by ion implantation. This means that the N$^-$ type semiconductor region N1 and the P$^+$ type semiconductor region P1 are formed in respectively different ion implantation steps using different photoresist films as a mask.

As a result, the photodiode PD comprised of a PN junction between the N$^-$ type semiconductor region N1 and the P$^+$ type semiconductor region P1 is formed in the main surface of the semiconductor substrate SB between the gate electrode G1 and the element isolation region EI. The gate electrode G1 is placed so as to be sandwiched, in plan view, between the element isolation regions EI. The photodiode PD is formed in an active region between the gate electrode G1 and one of the element isolation regions EI beside the gate electrode G1 and the photodiode PD is not formed in an active region between the gate electrode G1 and the other element isolation region EI beside the gate electrode G1.

Here, implantation by the ion implantation is performed using the photoresist film (not shown) formed using photolithography and the gate electrode G1 as masks. An impurity ion is therefore not injected into the logic circuit region 1B. This means that neither the N$^-$ type semiconductor region N1 nor the P$^+$ type semiconductor region P1 is formed in the logic circuit region 1B. The N$^-$ type semiconductor region N1 is formed adjacent to the gate electrode G1, while the P$^+$ type semiconductor region P1 is formed at a position right above the N$^-$ type semiconductor region N1 and separated from the gate electrode G1. This means that the N$^-$ type semiconductor region N1 is exposed from the main surface of the semiconductor substrate SB between the gate electrode G1 and the P$^+$ type semiconductor region P1.

Figure 11:
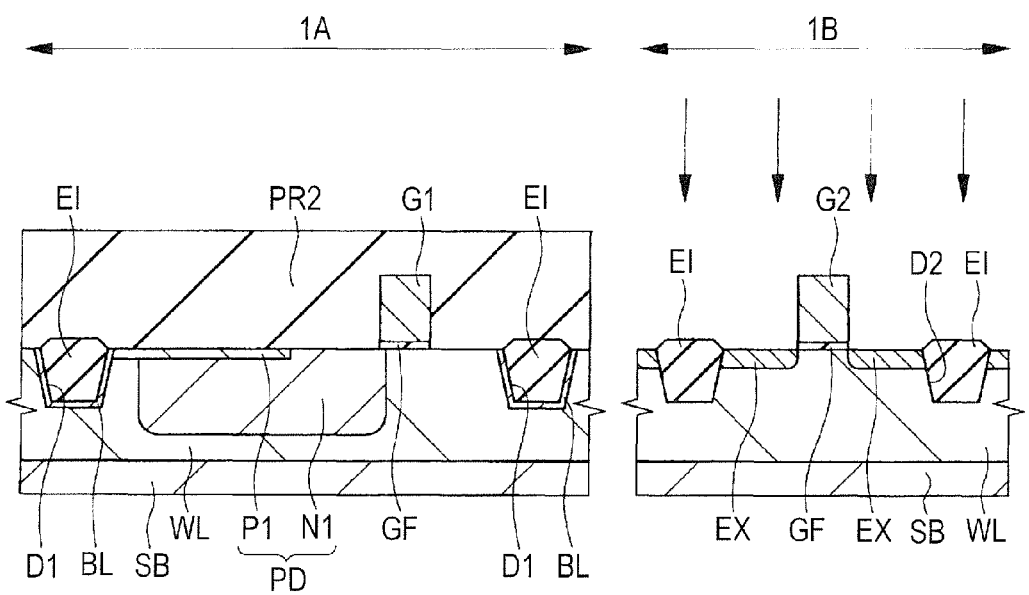
FIG. 11 is a cross-sectional view of the semiconductor device during a manufacturing step following that of FIG. 10.

Next, after the pixel region 1A is covered with the photoresist film PR2 as shown in FIG. 11, a pair of extension regions EX is formed in the main surface of the semiconductor substrate SB in the logic circuit region 1B while using the photoresist film PR2 and the gate electrode G2 as masks. Here, the pair of extension regions EX, which are N$^-$ type semiconductor regions, is formed so as to sandwich the gate electrode G2 therebetween in plan view, for example, by implanting an N type impurity (for example, P (phosphorus) or arsenic (As)) at a relatively low concentration into the main surface of the semiconductor substrate SB exposed in the logic circuit region 1B by using, for example, ion implantation.

Figure 12:
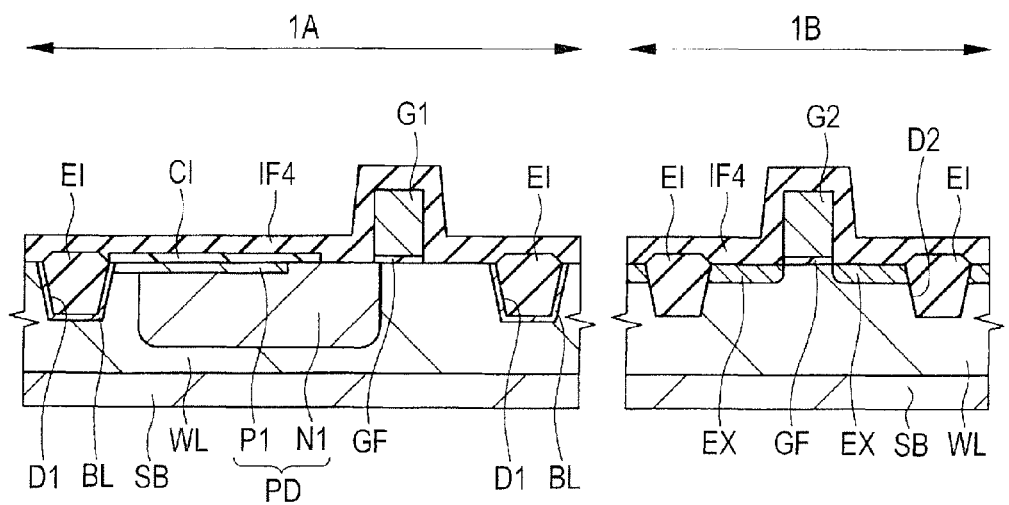
FIG. 12 is a cross-sectional view of the semiconductor device during a manufacturing step following that of FIG. 11.

Next, as shown in FIG. 12, after removal of the photoresist film PR2, a cap insulating film CI covering the upper surface of the photodiode PD and an insulating film IF4 covering the cap insulating film CI, the gate electrodes G1 and G2, the element isolation region EI, and the main surface of the semiconductor substrate SB are formed successively.

The cap insulating film CI is formed by forming a silicon oxide film covering the entire main surface of the semiconductor substrate SB using, for example, CVD and then processing the silicon oxide film using photolithography and etching. The cap insulating film CI is a film covering the upper surface of the photodiode PD and does not cover the other active region. Here, the cap insulating film CI is formed using CVD, but alternatively, an insulating film configuring the gate insulating film GF in the pixel region 1A is left on the photodiode PD formation region and a portion of the insulating film right above the photodiode PD may be used as the cap insulating film.

The insulating film IF4 is made of, for example, a silicon nitride film and it can be formed using, for example, CVD after formation of the cap insulating film CI.

Figure 13:
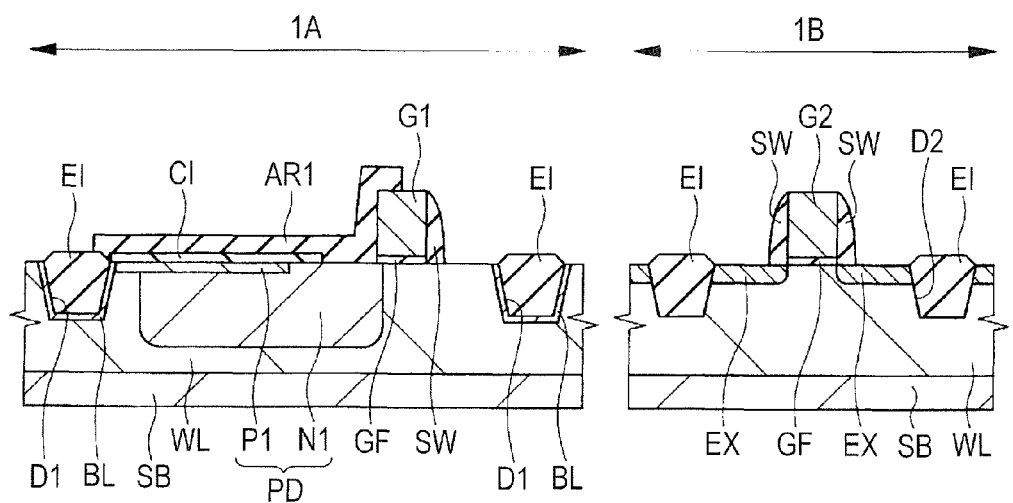
FIG. 13 is a cross-sectional view of the semiconductor device during a manufacturing step following that of FIG. 12.

Next, the insulating film IF4 is processed using photolithography and dry etching as shown in FIG. 13. Here, etching is performed using, as a mask, a photoresist film (not shown) covering the photodiode PD, a portion of the gate electrode G1 adjacent to the photodiode PD and a portion of the element isolation region EI, and the gate electrodes G1 and G2. An anti-reflective film AR1 made of the insulating film IF4 therefore remains right above the photodiode PD while extending between the upper surface of the gate electrode G1 and the upper surface of the element isolation region EI placed so as to sandwich the photodiode PD therebetween in plan view.

In addition, a sidewall SW made of the insulating film IF4 is formed in self alignment so as to be contiguous to the side wall of the gate electrode G1 on the side opposite to the side wall to which the anti-reflective film AR is contiguous. Further, a sidewall SW made of the insulating film IF4 is formed in self alignment so as to be contiguous to the side wall on both sides of the gate electrode G2.

Figure 14:
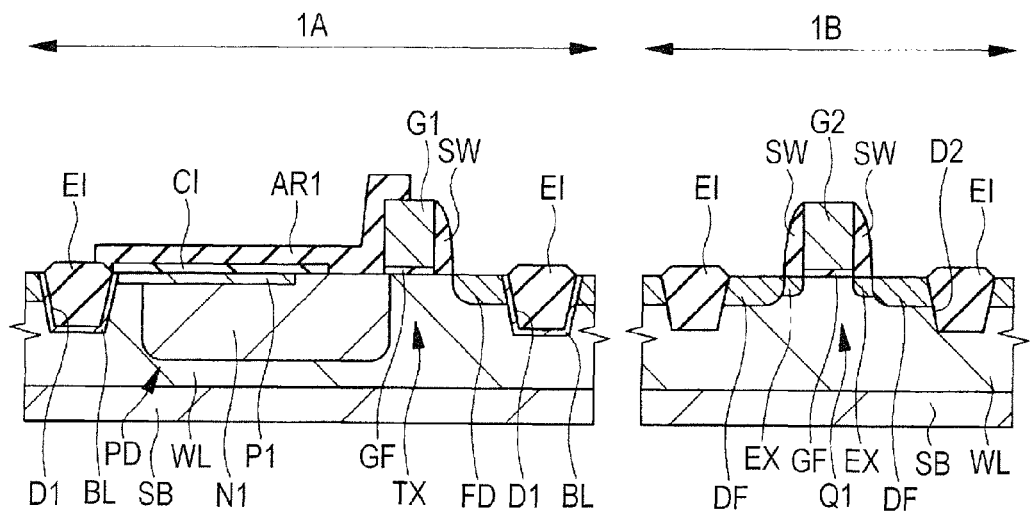
FIG. 14 is a cross-sectional view of the semiconductor device during a manufacturing step following that of FIG. 13.

Next, as shown in FIG. 14, a floating diffusion capacitance portion FD of the pixel region 1A and a diffusion layer DF of the logic circuit region 1B are formed by implanting an N type impurity (for example, P (phosphorus) or arsenic (As)) into the main surface of the semiconductor substrate SB at a relatively high concentration, with the gate electrodes G1 and G2, anti-reflective film AR1, and sidewall SW as masks. The floating diffusion capacitance portion FD is an N$^+$ type semiconductor region and is formed in the main surface of the semiconductor substrate SB exposed from the anti-reflective film AR1 between the element isolation region EI and the sidewall contiguous to one of the side walls of the gate electrode G1. A pair of the diffusion layers DF, each an N$^+$ type semiconductor region, is formed in the main surface of the semiconductor substrate B so as to sandwich, in plan view, the gate electrode G2 and the sidewall SW on both sides thereof.

As a result, a transistor Q1, which is a MOSFET, including a pair of source/drain regions comprised of the diffusion layer DF and the extension region EX and the gate electrode G2 is formed in the logic circuit region 1B, while a transistor TX, which is a MOSFET, including a pair of source/drain regions comprised of the N$^-$ type semiconductor region N1 and the floating diffusion capacitance portion FD and the gate electrode G2 is formed in the pixel region 1A.

The two source/drain regions in the logic circuit region 1B each have an LDD (lightly doped drain) structure comprised of the extension region EX having a relatively low impurity concentration and the diffusion layer DF having a relatively high impurity concentration. The floating diffusion capacitance portion FD and the diffusion layer DF have a formation depth deeper than that of the extension region EX.

In the transfer transistor TX, the N$^-$ type semiconductor region N1 functions as a source region of the transfer transistor TX and the floating diffusion capacitance portion FD functions as a drain region of the transfer transistor TX. Although not described here, the drain region of the transfer transistor TX may include, in addition to the floating diffusion capacitor portion FD, an extension region EX having an impurity concentration lower than that of the floating diffusion capacitance portion FD.

By the above-described steps, a reset transistor, an amplifier transistor, and a select transistor which are peripheral transistor described later, are formed in a region not shown in the drawings. By the steps described so far, a pixel PE (refer to FIG. 22) including the photodiode PD, the transfer transistor TX, and peripheral transistors (not shown) is formed. Although not illustrated here, a plurality of pixels PE is formed in matrix form in a pixel array portion over the semiconductor substrate SB. This means that a plurality of the photodiodes PD and a plurality of the peripheral transistors thereof are formed in matrix form in the pixel array portion.

Figure 15:
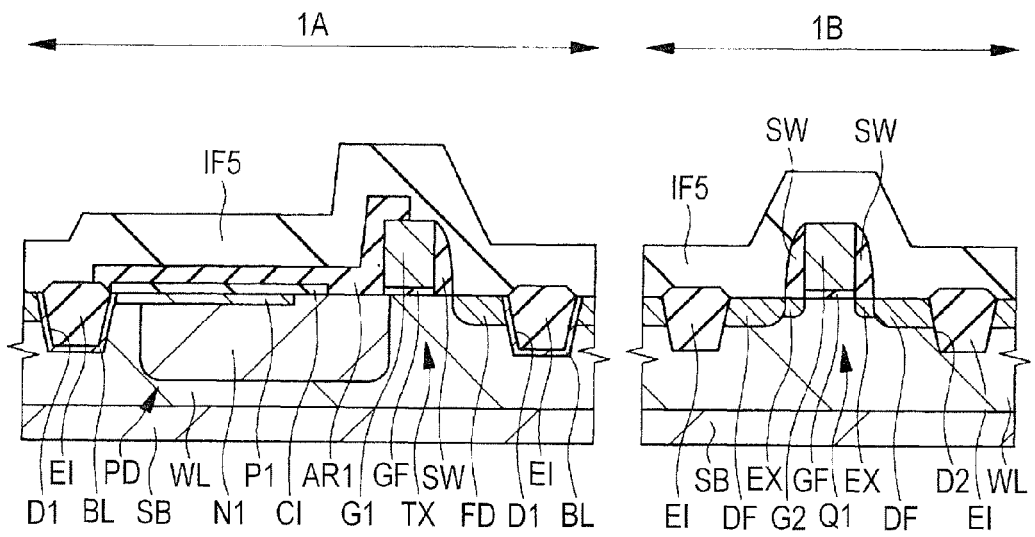
FIG. 15 is a cross-sectional view of the semiconductor device during a manufacturing step following that of FIG. 14.

Next, as shown in FIG. 15, an insulating film IF5 made of a silicon oxide film is formed on the entire main surface of the semiconductor substrate SB using, for example, CVD.

Figure 16:
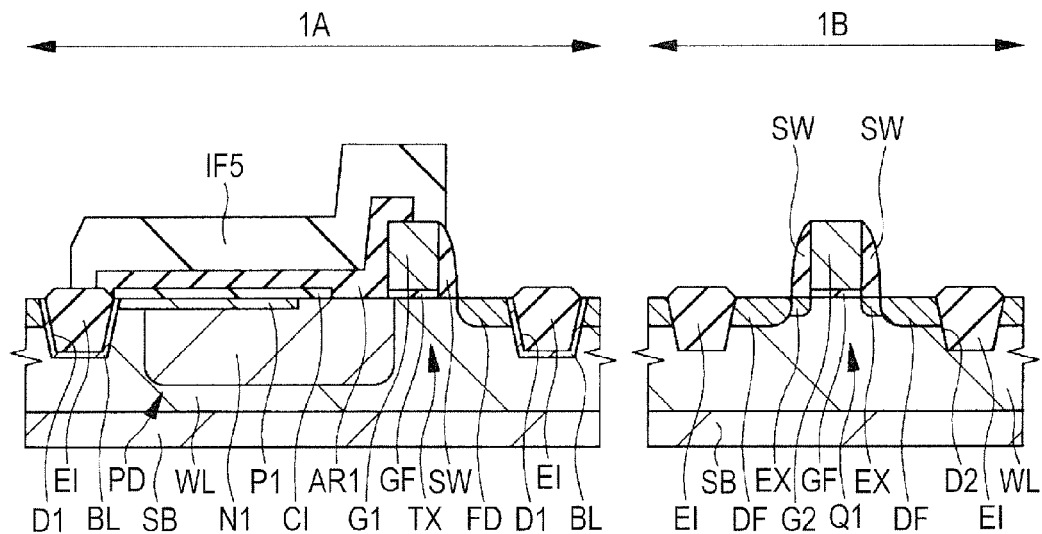
FIG. 16 is a cross-sectional view of the semiconductor device during a manufacturing step following that of FIG. 15.

Next, as shown in FIG. 16, the insulating film IF5 is processed using photolithography and dry etching. By this processing, the insulating film IF5 is removed from the logic circuit region 1B and the transistor Q1 is exposed from the insulating film IF5. In the pixel region 1A, the upper surface of the floating diffusion capacitance portion FD is exposed from the insulating film IF5. In this step, the upper surface of the gate electrode G1 remains covered with the insulating film IF5. The upper surface of the photodiode PD is covered with the cap insulating film CI, the anti-reflective film AR1, and the insulating film IF5. The insulating film IF5 is used as a mask in the salicide process to be performed next.

Figure 17:
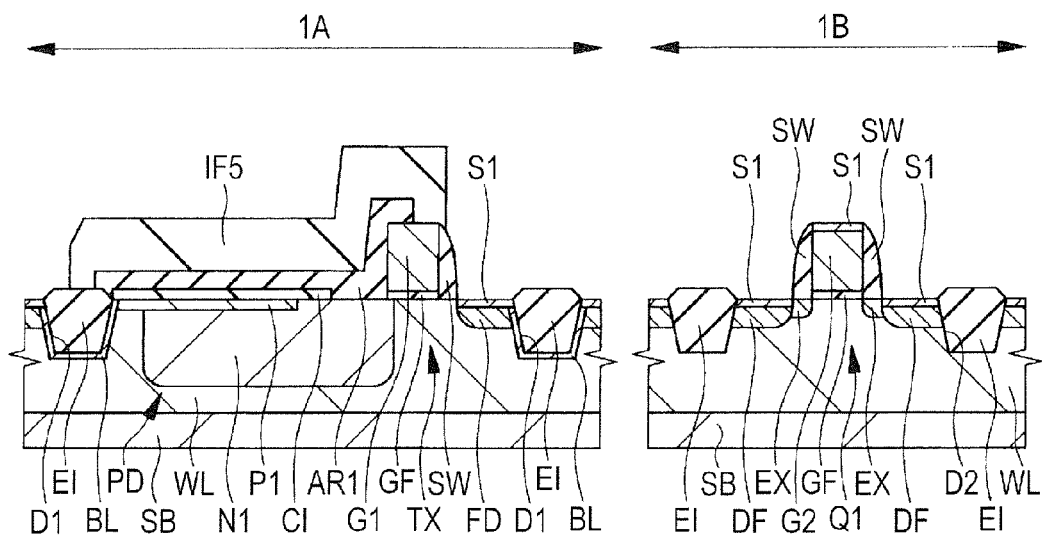
FIG. 17 is a cross-sectional view of the semiconductor device during a manufacturing step following that of FIG. 16.

Next, as shown in FIG. 17, the salicide process is performed to form a silicide layer S1 on the upper surface of the floating diffusion capacitance portion FD, the upper surface of the diffusion layer DF, and the upper surface of the gate electrode G2. No silicide layer S1 is formed on the upper surface of the gate electrode G1 covered with the insulating film IF5. In the present salicide process, after sputtering and thereby forming a metal film containing, for example, Ni (nickel) on the entire upper surface of the semiconductor substrate B, the semiconductor substrate SB is heated to cause a reaction between the metal film and a semiconductor to form a silicide layer S1. An unreacted portion of the metal film is then removed.

Figure 18:
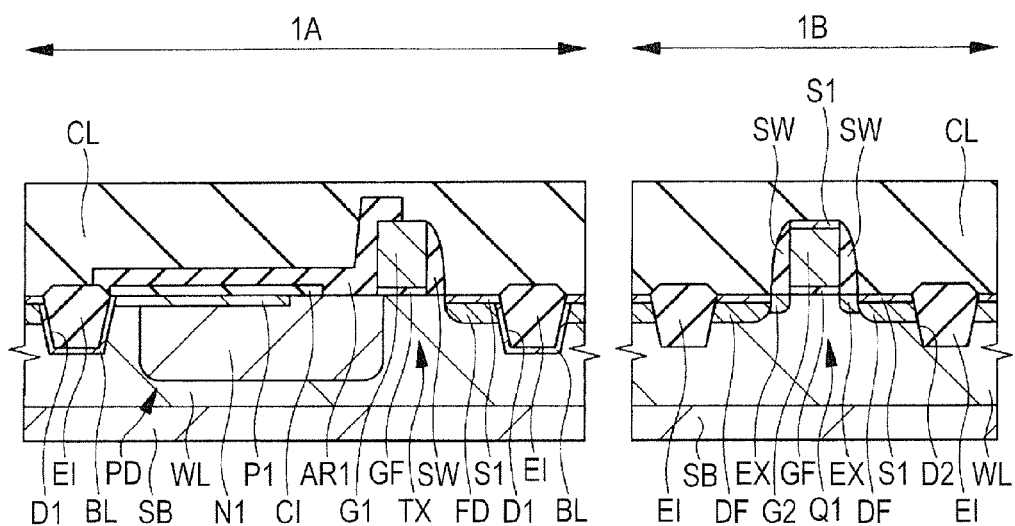
FIG. 18 is a cross-sectional view of the semiconductor device during a manufacturing step following that of FIG. 17.

Next, as shown in FIG. 18, an interlayer insulating film CL is formed on the semiconductor substrate SB. The interlayer insulating film CL is formed by forming a silicon oxide film on the entire main surface of the semiconductor substrate SB, for example, by CVD and then polishing the upper surface of the silicon oxide film by CMP or the like. The thickness of the interlayer insulating film CL is greater than the height of the upper surface of the gate electrode G1 or G2. The interlayer insulating film CL may be formed after removal of the insulating film IF5. Alternatively, the insulating film IF5 and the interlayer insulating film CL may be formed as one film by forming the interlayer insulating film CL while leaving the insulating film IF5.

Figure 19:
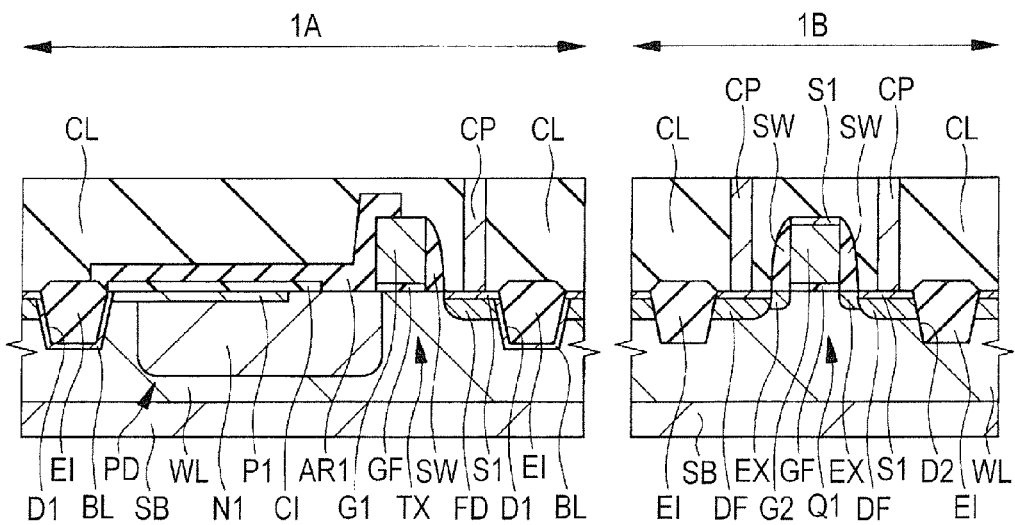
FIG. 19 is a cross-sectional view of the semiconductor device during a manufacturing step following that of FIG. 18.

Next, as shown in FIG. 19, after formation of a plurality of contact holes penetrating through the interlayer insulating film CL by photolithography and dry etching, a plurality of contact plugs CP to be buried in the contact holes is formed. Here, the plurality of contact holes is formed so as to expose, from the interlayer insulating film CL, each of the gate electrodes G1 and G2, the floating diffusion capacitance portion FD, and the diffusion layer DF. The upper surface of the silicide layer S1 or the gate electrode G1 is exposed from the bottom surface of the contact hole. The light receiving portion including the photodiode PD does not have a contact hole right thereabove. This drawing shows the contact plug CP electrically coupled to the floating diffusion capacitance portion FD and the diffusion layer DF and does not show the contact plug CP on each of the gate electrodes G1 and G2.

After formation of a metal film mainly containing W (tungsten) on the interlayer insulating film CL including the inside of the plurality of contact holes, the metal film on the interlayer insulating film CL is removed, for example, by polishing by CMP to expose the upper surface of the interlayer insulating film CL. In such a manner, the plurality of contact plugs CP made of the metal film buried in the plurality of contact holes is formed. The contact plugs CP are each comprised of a stacked film containing a titanium nitride film covering the side wall and bottom surface in the contact hole and a tungsten film buried in the contact hole via the titanium nitride film.

Figure 20:
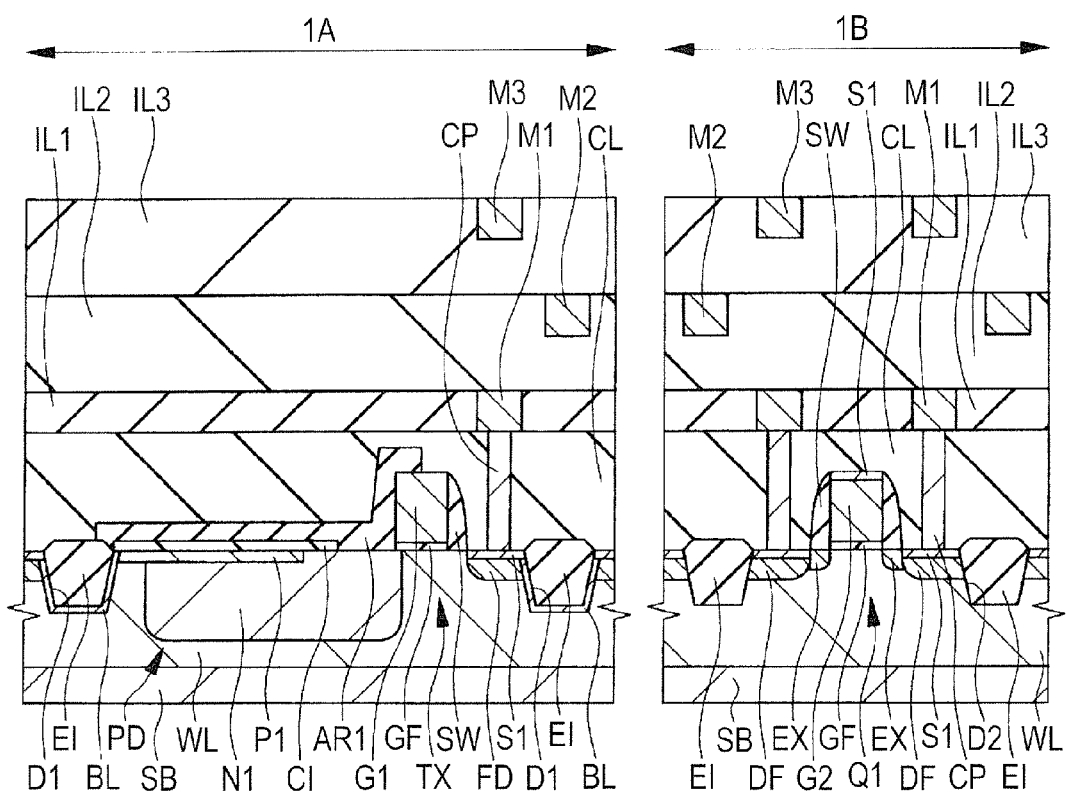
FIG. 20 is a cross-sectional view of the semiconductor device during a manufacturing step following that of FIG. 19.

Next, as shown in FIG. 20, a first wiring layer, a second wiring layer, and a third wiring layer are stacked one after another. The first wiring layer is comprised of the interlayer insulating film IL1 and a wiring M1; the second wiring layer is comprised of an interlayer insulating film IL2 and a wiring M2; and the third wiring layer is comprised of an interlayer insulating film IL3 and a wiring layer M3. The wiring M1, which is a lower wiring, is formed using a so-called single damascene process and the wirings M2 and M3, upper wirings, are formed using a so-called dual damascene process. When these damascene processes are used, the wirings M1 to M3 are formed, for example, from a Cu (copper) film. When wirings are formed and then a space adjacent to the wirings is filled with an interlayer insulating film without using these damascene processes, the wirings M1 to M3 are formed, for example, from an Al (aluminum) film.

Here, formation of wiring layers using the damascene process is described. After the structure shown in FIG. 19 is obtained, an interlayer insulating film IL1 made of, for example, a silicon oxide film is formed on the interlayer insulating film CL, for example, by CVD as shown in FIG. 20. Then, the interlayer insulating film IL1 is processed using photolithography and dry etching to form a wiring trench which is an opening portion penetrating through the interlayer insulating film IL1 and exposes the upper surface of the interlayer insulating film CL and the upper surface of the contact plug CP. Then, a metal film is formed on the interlayer insulating film IL1 including the inside of the wiring trench, followed by removal of an unnecessary portion of the metal film on the interlayer insulating film IL1 by CMP or the like to form a wiring M1 made of the metal film buried in the wiring trench is formed.

The wiring M1 has a stacked structure obtained by successively stacking, for example, a tantalum nitride film and a copper film. The side wall and bottom surface in the wiring trench are covered with the tantalum nitride film. The wiring M1 is, at the bottom surface thereof, coupled to the upper surface of the contact plug CP.

Then, a via (not shown), a wiring M2, and an interlayer insulating film IL2 are formed on the interlayer insulating film IL1 and the wiring M1. The dual damascene process used here is, for example, a process of forming an interlayer insulating film IL2, forming a via hole penetrating through the interlayer insulating film IL2, forming a wiring trench shallower than the via hole in the upper surface of the interlayer insulating film IL2 right above the via hole, and filling the via hole and the wiring trench with a metal, and thereby simultaneously forming the via in the via hole and the wiring M2 in the wiring trench thereabove. The via and the wiring M2 may be formed after forming a wiring trench and then providing a via hole penetrating from the bottom surface of the wiring trench to the bottom surface of the interlayer insulating film IL2. The wiring M1 is electrically coupled to the wiring M2 via the via.

Similar to the second wiring layer, a third wiring layer comprised of the interlayer insulating film IL3, a via (not shown), and a wiring M3 is formed on the interlayer insulating film IL2. The wiring M3 is electrically coupled to the wiring M1 via the via and the wiring M2. An insulating film IF6 covering the upper surface of the third wiring layer is then formed. The insulating film IF6 is formed, for example, using CVD and is made of, for example, a silicon oxide film.

The wirings M1 to M3 are formed in the pixel region 1A and the logic circuit region 1B, but in the pixel region 1A, the wirings M1 to M3 are not placed right above the photodiode PD in order to prevent the wirings M1 to M3 from blocking light incident from above the photodiode PD.

Figure 21:
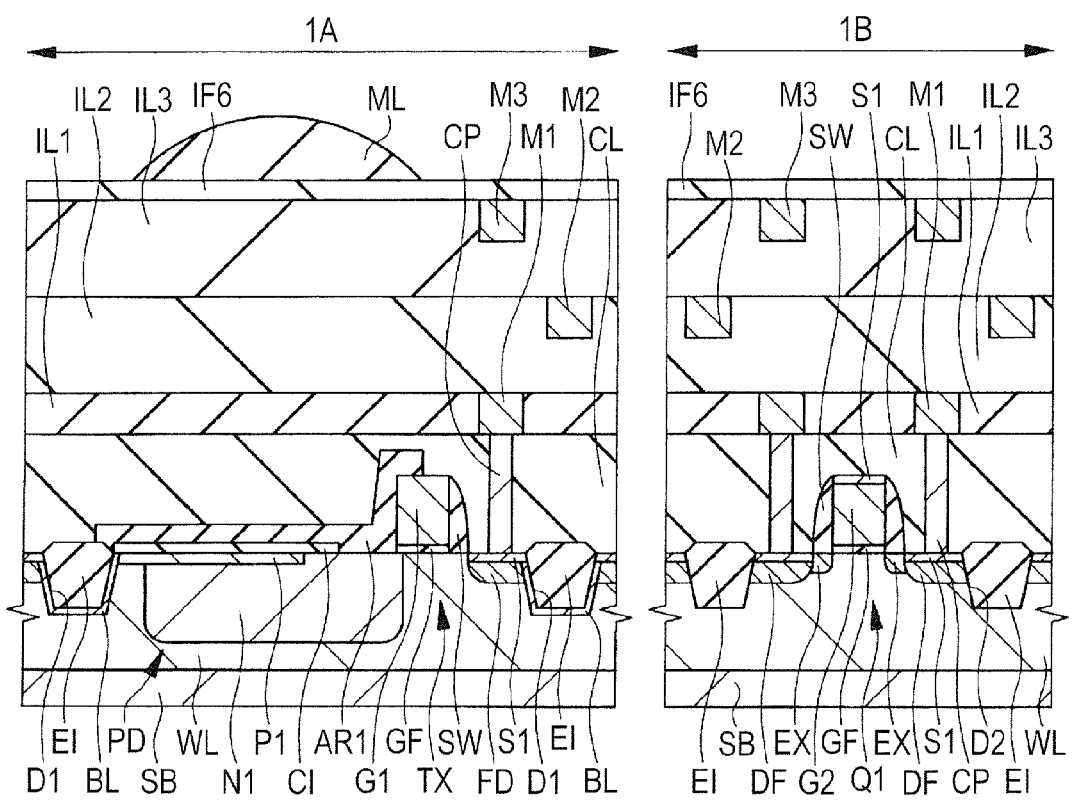
FIG. 21 is a cross-sectional view of the semiconductor device during a manufacturing step following that of FIG. 20.

Next, as shown in FIG. 21, a microlens ML is formed on the insulating film IF6 in the pixel region 1A. The interlayer insulating film IL3 and the microlens ML may have a color filter therebetween. The microlens ML is formed right above the photodiode PD. The microlens ML is formed by processing a film formed on the insulating film IF6 into a circular pattern in plan view, rounding the surface of the film, for example, by heating the film, and then, processing the resulting film into a lens form.

In a subsequent step, the semiconductor substrate SB, that is, a semiconductor wafer is cut by dicing along the scribe line thereof. The semiconductor device is thus divided into a plurality of sensor chips and a plurality of image pickup elements comprised of the sensor chips is formed. As a result, the semiconductor device of the present embodiment including the image pickup element is completed.

<Structure and Operation of Image Pickup Element as Semiconductor Device>

Figure 22:
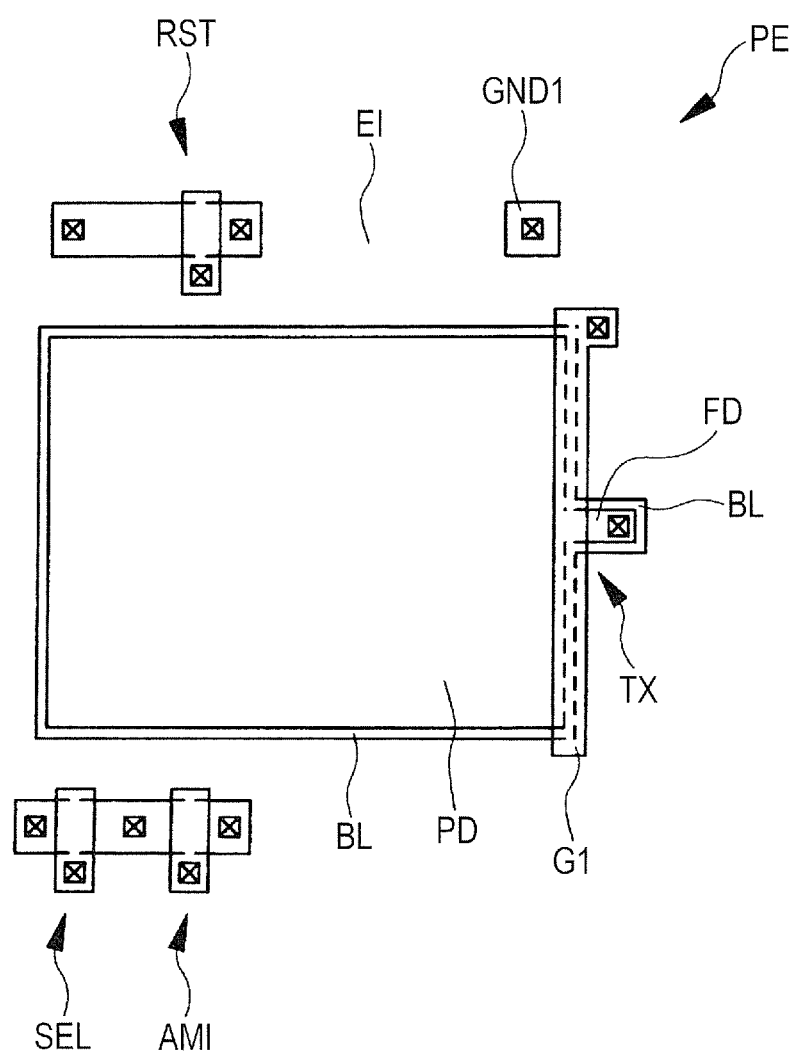
FIG. 22 is a plan view showing the layout of the semiconductor device of First Embodiment of the invention.
Figure 23:
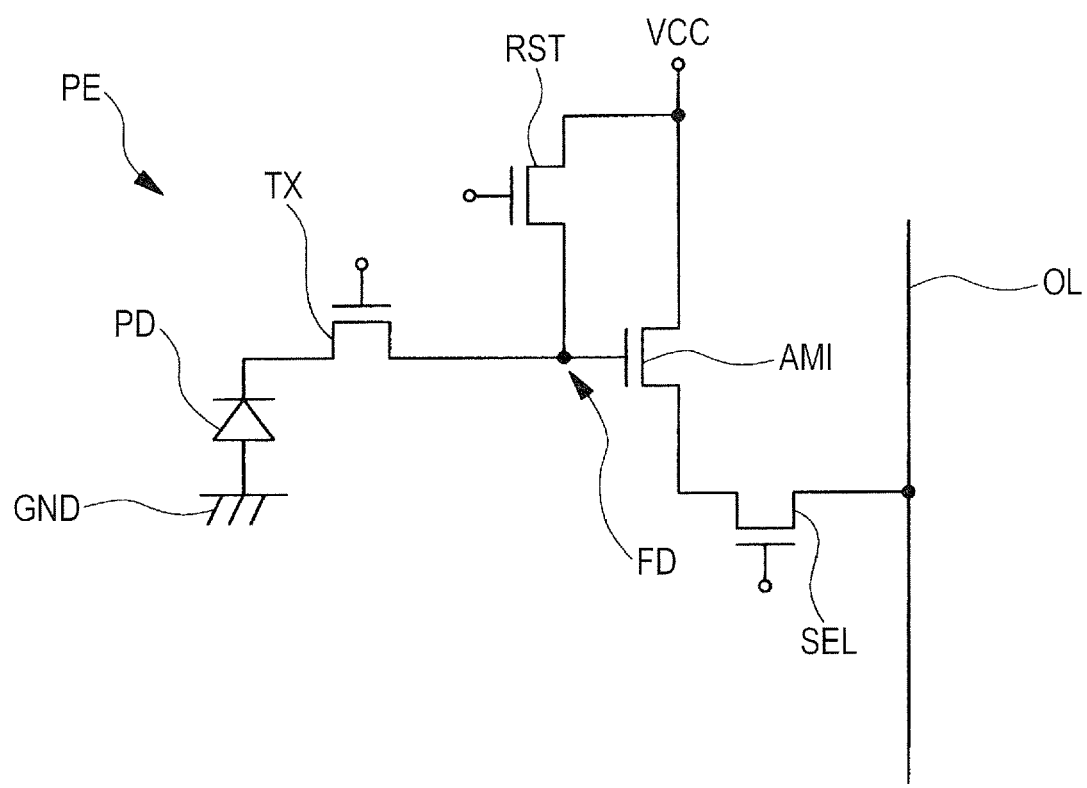
FIG. 23 is an equivalent circuit diagram showing the semiconductor device of First Embodiment of the invention.

The structure and operation of the image pickup element, which is the semiconductor device of the present embodiment, will hereinafter be described referring to FIGS. 22 and 23. FIG. 22 is a plan view showing the layout of the semiconductor device of the present embodiment. FIG. 23 is an equivalent circuit diagram showing the semiconductor device of the present embodiment. The image pickup element, which is the semiconductor device of the present embodiment, is a CMOS image sensor comprised of one semiconductor chip and the image pickup element has, in a pixel array portion thereof, a plurality of pixels. This means that in the pixel array portion, a plurality of pixels are arranged in matrix form. In FIG. 22, a profile of the active region at a position covered with each gate electrode and a profile of the semiconductor layer BL which is a boron implanted region are shown in broken lines.

As shown in FIG. 22, each pixel PE has a photodiode PD and a plurality of peripheral transistors. The photodiode PD is surrounded by the element isolation region EI. The photodiode PD has, in plan view, a rectangular shape. An active region having the photodiode PD therein has, in plan view, a partially protruded portion from one side of the rectangular shape and the protruded portion has, in the vicinity thereof, a transfer transistor TX.

The transfer transistor TX has, as the source/drain regions, the floating diffusion capacitance portion FD formed at the protruded portion and the N⁻ type semiconductor region configuring the photodiode PD formed in the rectangular shape portion, and has the gate electrode G1 formed, in plan view, between the source/drain regions. Along the peripheral edge of the active region having therein the source/drain regions and the photodiode PD, the boron-introduced semiconductor layer BL surrounds them circularly at a uniform impurity concentration. In other words, the semiconductor layer BL is formed in the surface of the semiconductor substrate adjacent to the element isolation region EI, that is, at an end portion, in plan view, of the active region including the photodiode PD. It surrounds the active region continuously.

Each pixel PE has, in a region thereof adjacent to the photodiode PD, a ground region GND1 and a reset transistor RST, an amplifier transistor AMI, and a select transistor SEL which are peripheral transistors. Here, an active region having therein the photodiode PD and the transfer transistor TX, an active region having therein the reset transistor, an active region having the amplifier transistor AMI and the select transistor SEL, and an active region having therein the ground region GND1 are respectively different and separated from one another by the element isolation region EI. The amplifier transistor AMI and the select transistor SEL are in the same active region and have one of the source/drain regions in common in the active region. The peripheral transistors are formed in the pixel region but the active region having therein each peripheral transistor does not have the boron-containing semiconductor layer BL.

Next, FIG. 23 shows a circuit of each pixel. A plurality of pixels each has the circuit shown in FIG. 23. As shown in FIG. 23, each pixel has a photodiode PD where photoelectric conversion is performed and a transfer transistor TX that transfers charges generated in the photodiode. In addition, the pixel has a floating diffusion capacitance portion FD that accumulates charges transferred from the transfer transistor TX and an amplifier transistor AMI that amplifies the potential of the floating diffusion capacitance portion. The pixel further has a select transistor SEL that selects whether or not the potential amplified at the amplifier transistor AMI is output to an output line OL coupled to a read-out circuit (not shown) and a reset transistor RST that initializes the potential of a cathode of the photodiode PD and the floating diffusion capacitance portion FD to a predetermined potential.

The transfer transistor TX, the reset transistor RST, the amplifier transistor AMI, and the select transistor SEL are each, for example, an N type MOSFET.

A ground potential GND, which is a negative-side power supply potential, is applied to the anode of the photodiode PD and the cathode of the photodiode PD is coupled to the source of the transfer transistor TX. The floating diffusion capacitance portion FD is coupled to the drain of the transfer transistor TX, the source of the reset transistor RST, and the gate of the amplifier transistor AMI. A positive-side power supply potential VCC is applied to the drain of the reset transistor RST and the drain of the amplifier transistor AMI. The source of the amplifier transistor AMI is coupled to the drain of the select transistor SEL. The source of the select transistor SEL is coupled to the output line OL.

Next, operation of the pixel will be described. A predetermined potential is applied to the gate electrode of the transfer transistor TX and the reset transistor RST to turn ON both the transfer transistor TX and the reset transistor RST. Then, charges remaining in the photodiode PD and charges accumulated in the floating diffusion capacitance portion FD flow toward the positive-side power supply potential VCC and the charges of the photodiode PD and the floating diffusion capacitance portion FD are initialized. Then, the reset transistor RST is turned ON.

Next, the PN junction of the photodiode PD is irradiated with incident light and photoelectric conversion occurs at the photodiode PD. As a result, charges are generated in the photodiode PD. These charges are all transferred to the floating diffusion capacitance portion FD by the transfer transistor TX. The floating diffusion capacitance portion FD accumulates therein the transferred charges. The potential of the floating diffusion capacitance portion FD thereby changes.

Next, when the select transistor SEL is turned ON, the potential of the floating diffusion capacitance portion FD after the potential change is amplified by the amplifier transistor AMI and is then output to the output line OL. The read-out circuit reads the potential of the output line OL. In such a manner, from each of the plurality of pixels formed in the pixel array portion, electric charge information is read and the image picked up by an image pickup element can be obtained.

Advantage of Present Embodiment

Figure 26:
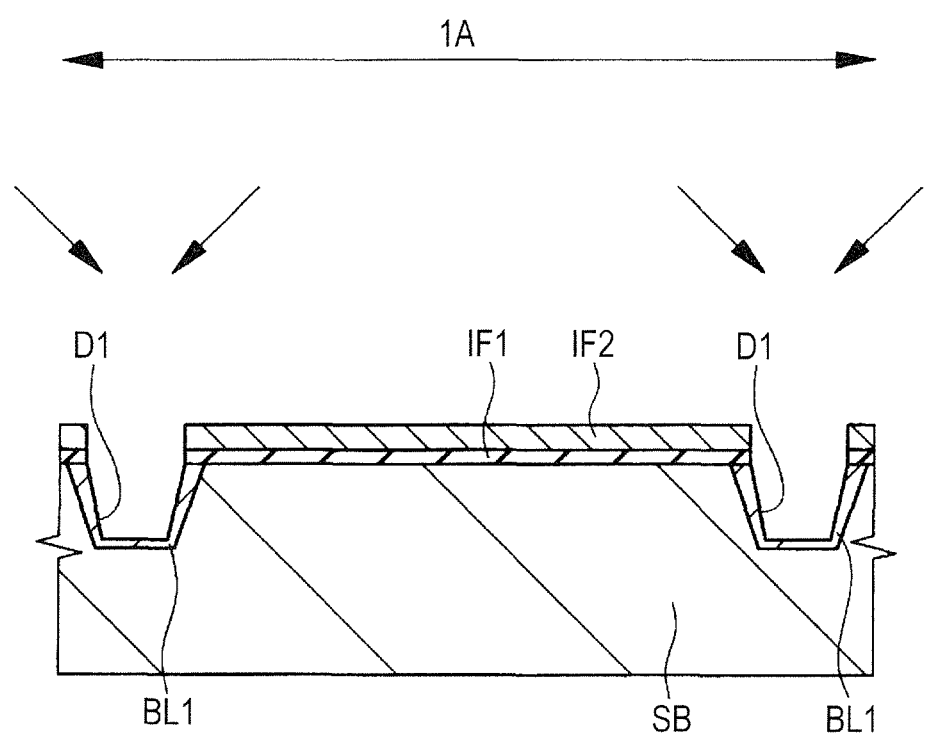
FIG. 26 is a cross-sectional view for describing a manufacturing step of a semiconductor device of Comparative Example.
Figure 27:
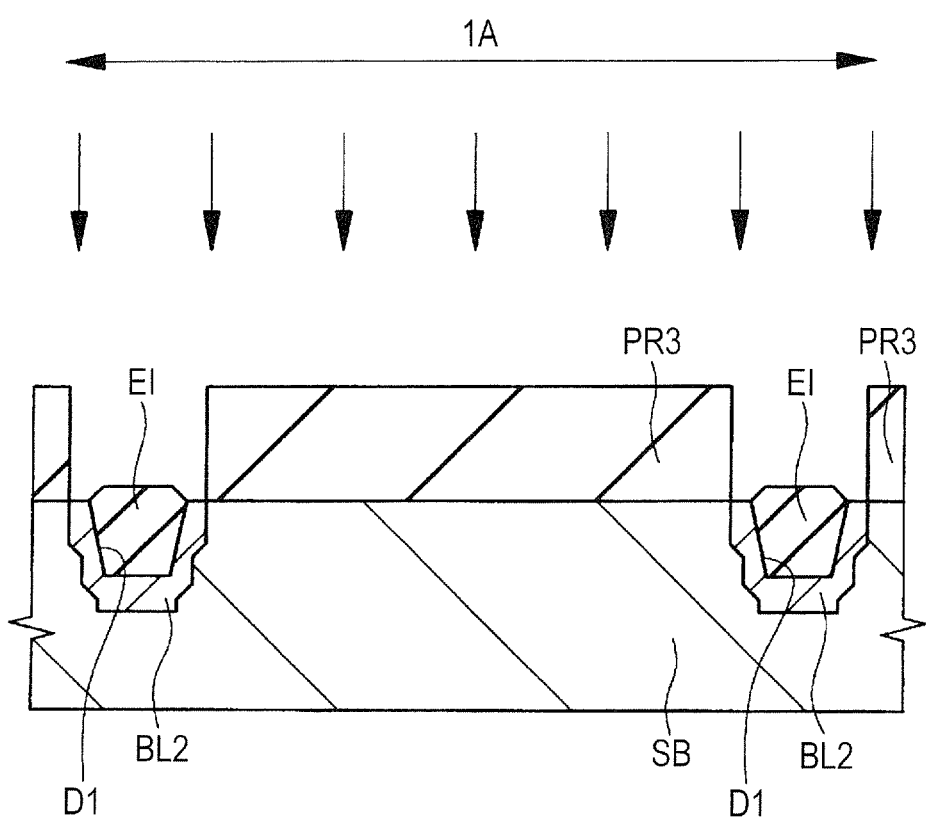
FIG. 27 is a cross-sectional view for describing a manufacturing step of a semiconductor device of another Comparative Example.

Advantages of the semiconductor device of the present embodiment will hereinafter be described using Comparative Examples shown in FIGS. 26 and 27. FIGS. 26 and 27 are cross-sectional views for describing manufacturing steps of semiconductor devices of Comparative Examples, respectively. FIGS. 26 and 27 show only the pixel region 1A but not show the logic circuit region 1B.

In image pickup elements, an element isolation region for defining a MOSFET and a photodiode is formed by STI in order to increase the speed of a CMOS, in a logic circuit region, to be mounted on a semiconductor chip. The element isolation region formed by STI is damaged more severely at a boundary between a semiconductor substrate and the element isolation region than the element isolation region formed by LOCOS (local oxidization of silicon), leading to easy generation of electrons at the boundary.

When the element isolation region is formed by filling a trench formed in the semiconductor substrate with an insulating film, the side wall and bottom surface of the trench are damaged by dry etching during formation of the trench by dry etching. At an interface between the semiconductor substrate and the element isolation region having an STI structure formed by filling the trench with an insulating film, electrons are generated due to the above damage. Diffusion of these electrons in the photodiode causes dark-time white spot defects in the pixel, leading to deterioration in pixel characteristics.

This means that due to diffusion of the electrons in the photodiode, more electrons than electrons generated by the above photoelectric conversion accumulate in the photodiode and charges read out from the pixel increase. In this case, of the image information read out by the image pickup element, the image at the pixel in which diffusion of the electrons has occurred becomes white. Correct pixel information cannot be obtained because of generation of electrons even in the pixel not exposed to light. Such impossibility of reading out normal image information is herein called "dark-time white spot defects".

In the dry etching step for forming a trench to be filled with an element isolation region, mixing of iron (Fe) in the side wall and bottom surface of the trench occurs. Diffusion of this iron in the photodiode also becomes a cause for dark-time white spot defects.

Occurrence of the above-described problem is presumed to be prevented by introducing boron (B) into a semiconductor substrate in the vicinity of a boundary between the element isolation region and the semiconductor substrate. When boron is introduced into the semiconductor substrate in the vicinity of the boundary, electrons generated in the boundary portion cannot exceed a potential barrier of the boron-introduced semiconductor layer so that diffusion of electrons into the photodiode can be prevented. In addition, holes in the boron-introduced semiconductor layer compensate electrons so that diffusion of electrons into the photodiode can be prevented. Further, boron captures iron in the semiconductor substrate through gettering so that diffusion of iron into the photodiode can be prevented.

The above-described introduction of boron can therefore prevent diffusion of electrons and iron and thereby preventing deterioration in pixel characteristics. In order to prevent penetration of electrons and iron into the photodiode, boron should be introduced uniformly into a region surrounding, in plan view, the photodiode.

With downsizing of semiconductor devices and increase in the number of pixels of an image pickup element, a photodiode of each pixel is presumed to be smaller. Even in such a case, the light receiving area of a photodiode of each pixel is desirably as large as possible from the standpoint of improving the sensitivity of an image pickup element. A semiconductor layer having boron introduced therein becomes a region not functioning as a photodiode that generates electrons by photoelectric conversion in PN junction. An excessively large thickness of the semiconductor layer, that is, a boron-introduced depth in the surface of the semiconductor substrate causes erosion of the end portion of the photodiode with the semiconductor layer and a decrease in the area of the photodiode, resulting in a problem of deterioration in pixel characteristics.

As in Comparative Example shown in FIG. 26, a semiconductor layer BL1 containing boron may be formed in the side wall and bottom surface of the trench D1 by, after the step described in FIG. 2, implanting boron into the side wall and bottom surface of the trench D1 by using oblique ion implantation. Oblique ion implantation is used in this method to implant boron not only into the bottom surface of the trench D1 but also into the side wall thereof.

In this Comparative Example, however, boron cannot easily be implanted into the trench D1 by oblique ion implantation because it is shaded by the semiconductor substrate SB and the insulating films IF1 and IF2 on the semiconductor substrate SB. Boron cannot therefore be implanted into the side wall and bottom surface of the trench D1 uniformly. This may cause variations in boron concentration of the semiconductor layer BL1 and electrons and iron may be diffused into the photodiode from a region poor in implanted amount of boron.

Increase in an implantation amount to prevent shortage in implantation amount of boron thickens the semiconductor layer BL1 so that a problem of decreasing an area of the photodiode and a problem of enhancing the damage of the semiconductor substrate by ion implantation may occur.

As in Comparative Example shown in FIG. 27, a boron introduction method may be performed by carrying out steps described referring to FIG. 1, FIG. 2 and FIGS. 5 to 7 without performing the boron introduction step described referring to FIGS. 3 and 4, and thereby forming the trench D1 and the element isolation region EI in the trench D1; and then carrying out multistage implantation of boron into the semiconductor substrate with a photoresist film PR3 as a mask. In this case, the boron-containing semiconductor layer BL2 is formed by implanting boron into the surface of the semiconductor substrate SB in the vicinity of the trench D1 in a plurality of times at varied ion implantation energies while exposing, from the photoresist film PR3, the main surface of the semiconductor substrate SB within a range of about 100 nm from the end portion of the element isolation region EI to a photodiode formation region.

When multistage implantation is performed as in the above-described Comparative Example, implantation damage caused in the surface of the semiconductor substrate SB including the side wall and bottom surface of the trench D1 becomes unignorably large. Due to the damage, dislocation defects are likely to occur. Multistage implantation of an impurity ion therefore damages the surface of the semiconductor substrate SB and boron (B) causes enhanced diffusion via the defects. In this case, boron which has penetrated deeply into the photodiode may reduce the sensitivity of the pixel.

Boron implanted by ion implantation easily diffuses by the thermal treatment performed after the ion implantation as in respective Comparative Examples of FIGS. 26 and 27 so that the semiconductor layers BL1 and BL2 formed by boron introduction have increased depth (thickness). It reduces the light receiving area of the photodiode, leading to deterioration in light receiving characteristics of the pixel. In particular, this problem becomes marked in pixels as minute as 1 μm or less.

As described above using Comparative Examples, it is necessary to uniformly and shallowly introduce boron into the side wall and bottom surface of the trench for preventing diffusion of electrons and iron, while preventing the side wall and bottom surface of the trench formed in the semiconductor substrate from being damaged.

In the present embodiment, therefore, as described using FIGS. 3 and 4, plasma doping is used to introduce boron into the side wall and bottom surface of the trench D1 formed in the upper surface of the semiconductor substrate SB and thus, the semiconductor layer BL is formed.

In the present embodiment not using ion implantation for introducing boron into the side wall and bottom surface of the trench D1, the side wall and bottom surface of the trench D1 can be prevented from being damaged due to the ion implantation or multistage ion implantation. Plasma doping gives a smaller damage to the surface of the semiconductor substrate SB than ion implantation. Dislocation defects due to the damage can therefore be prevented, making it possible to prevent enhanced diffusion of boron or the like.

Since ion implantation is not used for introducing boron into the side wall and bottom surface of the trench D1, the introduction depth of boron and also diffusion depth of boron by the thermal treatment can be reduced. In other words, the introduction depth of boron into the surface of the semiconductor substrate SB can be made smaller by plasma doping than by ion implantation and the diffusion amount due to thermal treatment after the plasma doping can be made smaller than the diffusion amount when ion implantation is used for boron introduction. More specifically, the thickness of the semiconductor layer BL formed by plasma doping is, for example, from 1 to 2 nm from the surface of the semiconductor substrate SB and this thickness does not increase even by thermal treatment.

The thickness of the semiconductor layer BL in the present embodiment, that is, the width of the semiconductor layer shown in FIG. 22 therefore becomes smaller than that in Comparative Example. A decrease in the light receiving area of the photodiode PD in plan view, as shown in FIG. 22, due to an increase in the width of the semiconductor layer BL around the photodiode PD can therefore be prevented. Deterioration in pixel characteristics can therefore be prevented. As a result, the semiconductor device including the image pickup element can have improved reliability.

In the present embodiment, boron is introduced into the semiconductor substrate not using oblique implantation as described referring to FIG. 26 but using plasma doping so that boron can be introduced uniformly (conformally) into the surface of the semiconductor substrate exposed from the insulating films IF1 and IF2 (refer to FIG. 4). It is therefore possible to prevent electrons and iron from being diffused into the photodiode from a position where an introduction amount of boron is particularly small as a result of non-uniform introduction of boron into the side surface and bottom surface of the trench D1 as in Comparative Example.

In the present embodiment, along the peripheral portion of the active region having therein the photodiode PD, the boron-introduced semiconductor layer BL surrounds it circularly at a uniform concentration as shown in FIG. 22 so that diffusion of electrons and iron into the photodiode PD from any position of the peripheral portion of the active region can be prevented. Dark-time white spot defects can therefore be prevented. The resulting semiconductor device including an image pickup element can therefore have improved reliability.

As described above referring to FIGS. 26 and 27, when the semiconductor layers BL1 and BL2 are formed using ion implantation and thereby implanting boron into the side wall and bottom surface of a trench to be filled with an element isolation region, boron introduced into the semiconductor layers BL1 and BL2 contain, as an isotope of boron, not $^{10}$B but $^{11}$B. Boron present in the natural world contains isotopes $^{11}$B and $^{10}$B at 8:2 and in ion implantation, not $^{10}$B but only $^{11}$B showing a higher production probability is used.

In the plasma doping step described in the present embodiment, on the other hand, a doping gas containing $^{11}$B and $^{10}$B is used so that the semiconductor layer BL shown in FIG. 4 contains $^{11}$B and $^{10}$B. The P well WL and P$^+$ type semiconductor region P1 shown in FIG. 21 and source/drain regions of the P MOSFET not shown in the drawing are regions implanted with boron by ion implantation and they each contain $^{11}$B but not contain $^{10}$B. Supposing that the P well WL, P$^+$ type semiconductor region P1, and source/drain regions of the P type MOSFET contain $^{10}$B, a proportion of $^{10}$B in boron in these P type semiconductor regions is smaller than that of $^{10}$B in the boron of the semiconductor layer BL formed by plasma doping.

As described above, in the method of manufacturing a semiconductor device according to the present embodiment, introduction of boron into the surface of the semiconductor substrate SB adjacent to the element isolation region EI by plasma doping makes it possible to prevent deterioration in pixel characteristics due to shrinkage of the light receiving area of the photodiode PD and at the same time, prevent generation of dark-time white spot defects due to diffusion of electrons and iron. The semiconductor device thus obtained can therefore have improved reliability.

Second Embodiment

In First Embodiment, an image pickup element that illuminates a photodiode with light from the main surface side of a semiconductor substrate has been described. The invention of the present application can also be applied to a back-illuminated image pickup element that illuminates a photodiode with light from the back surface side of a semiconductor substrate.

Figure 24:
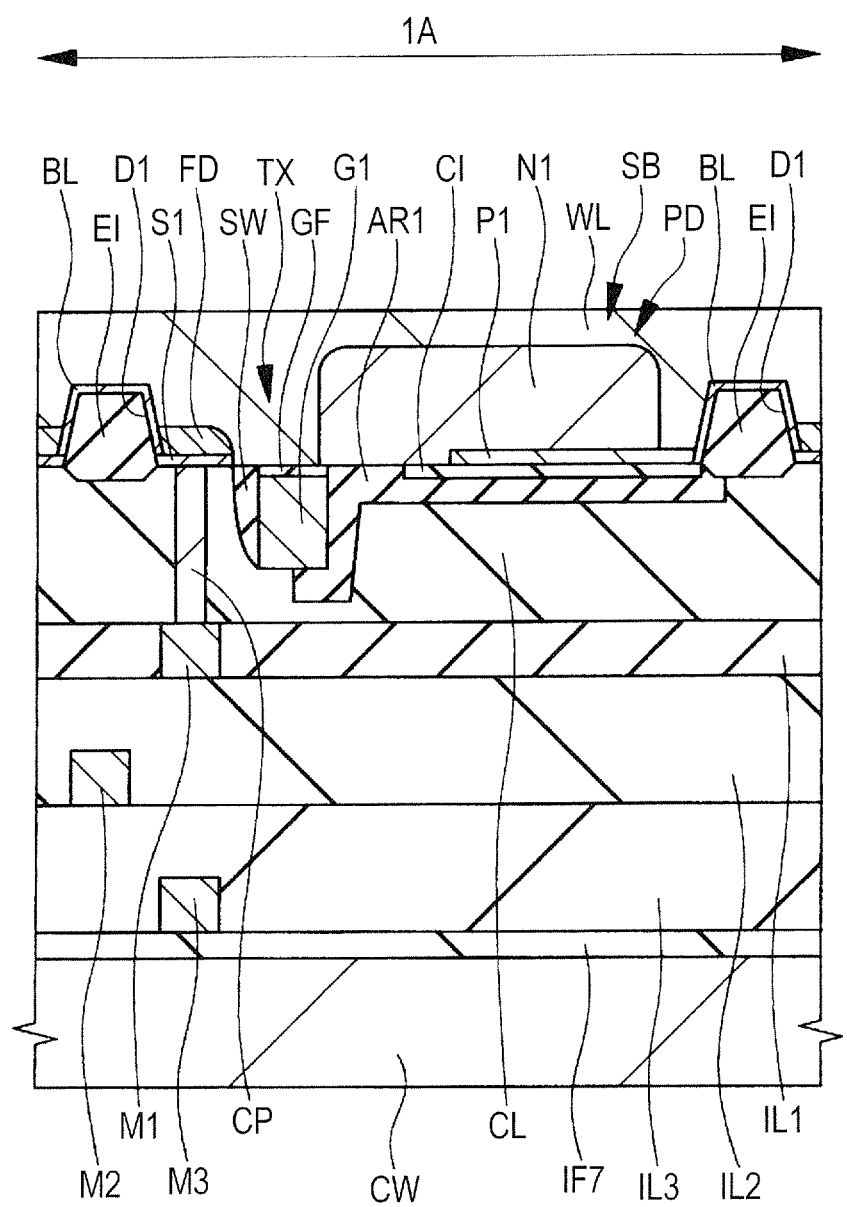
FIG. 24 is a cross-sectional view for describing a manufacturing step of a semiconductor device of Second Embodiment of the invention.
Figure 25:
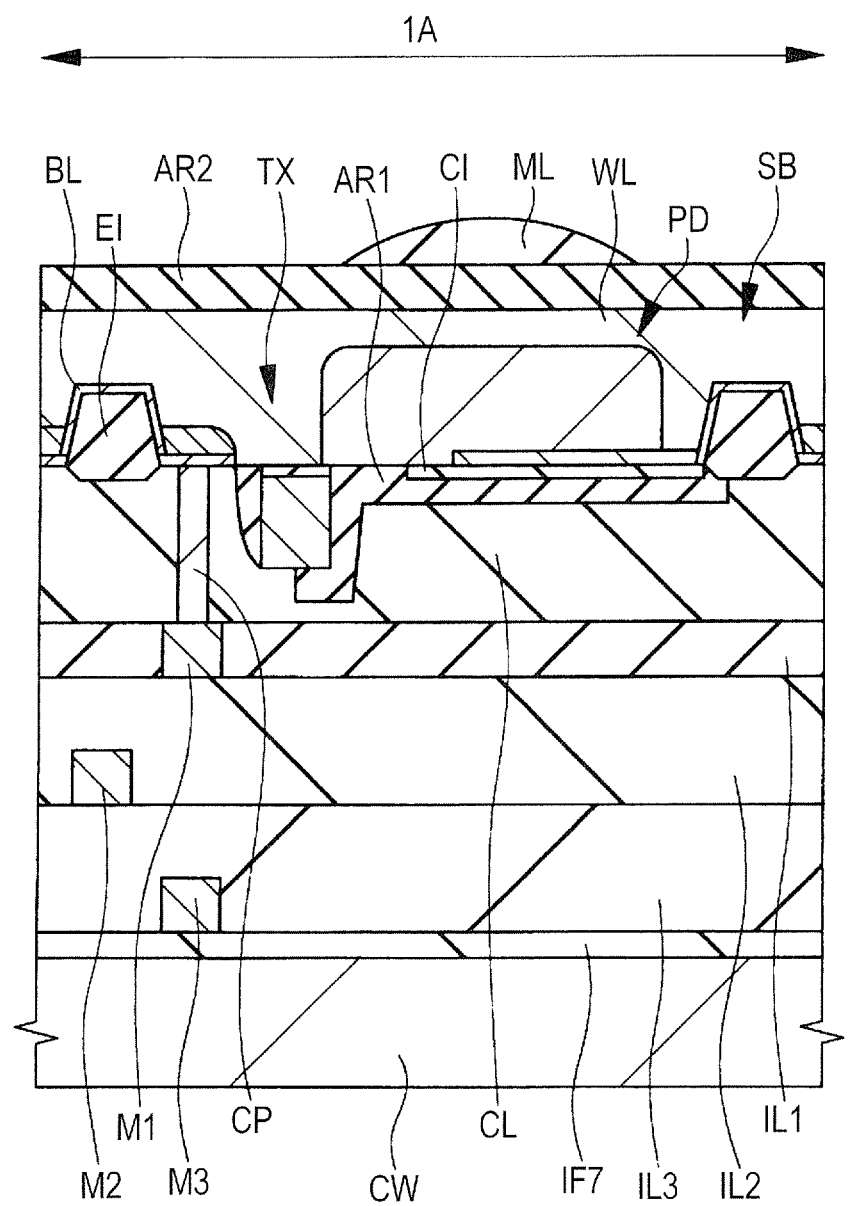
FIG. 25 is a cross-sectional view of the semiconductor device during a manufacturing step following that of FIG. 24.

Introduction of boron into a semiconductor substrate adjacent to an element isolation region by plasma doping in a back-illuminated image pickup element will hereinafter be described referring to FIGS. 24 and 25. Steps until formation of a plurality of wiring layers are similar to those of First Embodiment so that specific description on the manufacturing method until the formation of the wiring layers is omitted. FIGS. 24 and 25 are cross-sectional views for describing manufacturing steps of the semiconductor device of the present embodiment. FIGS. 24 and 25 show a cross-section in the pixel region 1A, but do not show that in a logic circuit region 1B (refer to FIG. 20).

An interlayer insulating film, a photodiode, a transfer transistor, an amplifier transistor, a select transistor, a reset transistor, a transistor of a logic circuit region, and a plurality of wiring layers are formed on a semiconductor substrate by carrying out steps described referring to FIGS. 1 to 20. Boron has been introduced into the surface of the semiconductor substrate adjacent to the interlayer insulating film as described referring to FIGS. 3 and 4 in First Embodiment, but the insulating film IF6 (refer to FIG. 21) is not formed in this embodiment.

Next, as shown in FIG. 24, the semiconductor substrate SB is turned upside down. The perpendicular direction and the main surface and back surface of the semiconductor substrate SB will however be described similarly to FIGS. 1, 2, and 4 to 20. The lower side of the semiconductor substrate in FIGS. 24 and 25 will be described as a main surface (upper surface) side of the semiconductor substrate and the upper side of the semiconductor substrate will be described as a back surface (lower surface) side of the semiconductor substrate SB. This means that, for example, in FIGS. 24 and 25, the lower surface of the interlayer insulating film IL1 is contiguous to the upper surface of the interlayer insulating film CL and the upper surface of the interlayer insulating film IL1 is contiguous to the lower surface of the interlayer insulating film CL.

Then, the upper surface of the interlayer insulating film IL3 and the upper surface of the wiring M3 are attached to the lower surface of a support substrate CW via an insulating film IF7 for adhesion. The support substrate CW is a silicon substrate prepared separately from the semiconductor substrate SB. The insulating film IF7 is made of a silicon oxide film formed so as to cover the back surface of the support substrate CW before the attaching step.

The back surface of the semiconductor substrate SB is then polished to thin the semiconductor substrate SB. Here, the polishing is performed until the thickness of the semiconductor substrate SB from the main surface to the back surface becomes from about 2 to 5 μm.

Next, as shown in FIG. 25, an anti-reflective film AR2 is formed to cover the back surface of the semiconductor substrate SB. The anti-reflective film AR2 is made of, for example, a silicon nitride film and is formed using, for example, CVD. A microlens ML covering the lower surface of the anti-reflective film AR2 is then formed right below the photodiode PD. This means that the microlens ML is formed on the back surface of the semiconductor substrate SB via the anti-reflective film AR2.

In a step subsequent thereto, the semiconductor substrate SB, that is, a semiconductor wafer is cut along a scribe line by dicing. The semiconductor chip is thereby divided into a plurality of sensor chips and a plurality of back-illuminated image pickup elements comprised of the sensor chip is formed. An advantage similar to that of First Embodiment can be obtained in the semiconductor device of the present embodiment.

The invention made by the present inventors has been described specifically based on some embodiments. It is needless to say that the present invention is however not limited by the above embodiments but can be changed in various ways without departing from the gist of the invention.

What is claimed is:

1. A method of manufacturing a semiconductor device including an image pickup element having a photoelectric conversion element that generates signal charges in response to an amount of incident light, comprising:
   (a) providing a semiconductor substrate;
   (b) forming a first trench that surrounds a first region of a main surface of the semiconductor substrate in the main surface of the semiconductor substrate;
   (c) introducing boron into a side wall and a bottom surface of the first trench by plasma doping and thereby forming a semiconductor layer containing boron on the side wall and the bottom surface of the first trench;
   (d) after the operation (c), filling the first trench with a first insulating film to form an element isolation region having the first insulating film; and
   (e) forming the photoelectric conversion element over the main surface of the semiconductor substrate in the first region,
   wherein the photoelectric conversion element has the P type semiconductor region and the N type semiconductor region, and
   wherein a proportion of $^{10}$B in boron in the P type semiconductor region is smaller than that of $^{10}$B in boron in the semiconductor layer.

2. The method of manufacturing a semiconductor device according to claim 1,
   wherein in the operation (b), in addition to the first trench, a second trench adjacent to a second region of the main surface of the semiconductor substrate is formed,
   wherein in the operation (c), boron is introduced into the side wall and the bottom surface of the first trench while covering the second region and the second trench with a mask,
   wherein in the operation (d), the first trench and the second trench are each filled with the first insulating film to form the element isolation region comprised of the first insulating film, and
   wherein the method further comprises the operation of:
   (f) forming a field effect transistor over the semiconductor substrate in the second region.

3. The method of manufacturing a semiconductor device according to claim 1,
   wherein the semiconductor layer contains $^{11}$B and $^{10}$B.

4. The method of manufacturing a semiconductor device according to claim 1,
   wherein the operation (e) comprises:
   (e1) implanting boron into the main surface of the semiconductor substrate in the first region to form a P type semiconductor region; and
   (e2) implanting an N type impurity into the main surface of the semiconductor substrate in the first region to form an N type semiconductor region.

5. The method of manufacturing a semiconductor device according to claim 1,
   wherein in the operation (c), the plasma doping is carried out while setting a pressure in a chamber of a plasma doping apparatus to be used for the plasma doping at from 50 to 150 mTorr.

6. The method of manufacturing a semiconductor device according to claim 1,
   wherein in the operation (c), the plasma doping is carried out while applying electricity of 0 W to a wafer stage, in a chamber of a plasma doping apparatus to be used for the plasma doping, on which the semiconductor substrate is placed.

7. The method of manufacturing a semiconductor device according to claim 1, further comprising:
   (c1) after the operation (c), thermally treating the semiconductor substrate at from 900 to 1000° C. to diffuse an impurity in the semiconductor layer.

8. The method of manufacturing a semiconductor device according to claim 7,
   wherein after the sub-operation (c1), the semiconductor layer has a thickness of 20 nm or more from the surface of the semiconductor substrate.

9. The method of manufacturing a semiconductor device according to claim 1,
   wherein the semiconductor layer has a boron concentration of 1×1017 m-3 or more.

10. The method of manufacturing a semiconductor device according to claim 1,
wherein in the operation (c), the plasma doping is carried out while using B2H6 as a doping gas and introducing boron in the doping gas into the side wall and bottom surface of the first trench to form the semiconductor layer.

11. The method of manufacturing a semiconductor device according to claim 1,
wherein the operation (b) comprises:
(b1) forming a mask pattern that covers the first region over the semiconductor substrate; and
(b2) performing anisotropic etching with the mask pattern as a mask to form the first trench.

12. The method of manufacturing a semiconductor device according to claim 11,
wherein in the operation (c), the plasma doping is carried out while covering the first region of the semiconductor substrate with the mask pattern to form the semiconductor layer.

13. The method of manufacturing a semiconductor device according to claim 11,
wherein in the operation (b2), iron is introduced into the side wall and the bottom surface of the first trench formed by the anisotropic etching.

14. The method of manufacturing a semiconductor device according to claim 1,
wherein in the operation (c), the semiconductor layer having a thickness, from the surface of the semiconductor substrate, of from 1 to 2 nm is formed.

15. The method of manufacturing a semiconductor device according to claim 1, further comprising:
forming a mask pattern that covers the first region over the semiconductor substrate, after the first trench is formed.

16. The method of manufacturing a semiconductor device according to claim 1,
wherein the operation (e) comprises:
implanting boron into the main surface of the semiconductor substrate in the first region to form a P type semiconductor region,
wherein a proportion of $^{10}B$ in boron in the P type semiconductor region is smaller than that of $^{10}B$ in boron in the semiconductor layer.

17. A method of manufacturing a semiconductor device including an image pickup element having a photoelectric conversion element that generates signal charges in response to an amount of incident light, comprising:
(a) providing a semiconductor substrate;
(b) forming a first trench that surrounds a first region of a main surface of the semiconductor substrate in the main surface of the semiconductor substrate;
(c) introducing boron into a side wall and a bottom surface of the first trench by plasma doping and thereby forming a semiconductor layer containing boron on the side wall and the bottom surface of the first trench;
(d) after the operation (c), filling the first trench with a first insulating film to form an element isolation region having the first insulating film;
(e) forming the photoelectric conversion element over the main surface of the semiconductor substrate in the first region,
wherein the operation (b) comprises: (b1) forming a mask pattern that covers the first region over the semiconductor substrate; and (b2) performing anisotropic etching with the mask pattern as a mask to form the first trench,
wherein in the operation (b2), iron is introduced into the side wall and the bottom surface of the first trench formed by the anisotropic etching,
wherein (c1) after the operation (c), thermally treating the semiconductor substrate at from 900 to 1000° C. to diffuse boron in the semiconductor layer, and
wherein after the operation (c1), a formation depth of the semiconductor layer from the surface of the semiconductor substrate is deeper than a depth of a region of the surface of the semiconductor substrate into which iron has been introduced in the operation (b2).

\* \* \* \* \*